(12) United States Patent
Brogan et al.

(10) Patent No.: US 12,648,416 B2
(45) Date of Patent: Jun. 2, 2026

(54) METAL OXIDE DIFFUSION BARRIERS

(71) Applicant: Lam Research Corporation, Fremont, CA (US)

(72) Inventors: Lee J. Brogan, Newberg, OR (US); Patrick A. Van Cleemput, Duvall, WA (US); Matthew Martin Huie, Tigard, OR (US); Kyle Jordan Blakeney, Fremont, CA (US); Yi Hua Liu, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 777 days.

(21) Appl. No.: 17/999,442

(22) PCT Filed: Jun. 25, 2021

(86) PCT No.: PCT/US2021/039189
§ 371 (c)(1),
(2) Date: Nov. 21, 2022

(87) PCT Pub. No.: WO2022/005907
PCT Pub. Date: Jan. 6, 2022

(65) Prior Publication Data
US 2023/0260834 A1 Aug. 17, 2023

Related U.S. Application Data

(60) Provisional application No. 62/705,518, filed on Jul. 1, 2020.

(51) Int. Cl.
*H01L 21/768* (2006.01)
*C23C 16/34* (2006.01)
(Continued)

(52) U.S. Cl.
CPC ........... *H10W 20/033* (2026.01); *C23C 16/34* (2013.01); *C23C 16/403* (2013.01);
(Continued)

(58) Field of Classification Search
CPC ......... H01L 21/76843; H01L 21/76814; H01L 21/76826; H01L 21/76831;
(Continued)

(56) References Cited

U.S. PATENT DOCUMENTS 6,008,117 A 12/1999 Hong et al.
6,077,774 A 6/2000 Hong et al.
(Continued)

FOREIGN PATENT DOCUMENTS

JP 2002083869 A 3/2002
JP 2008078647 A 4/2008
(Continued)

OTHER PUBLICATIONS

KR Office Action dated Sep. 23, 2022, in Application No. KR10-2015-0092053 with English translation.
(Continued)

*Primary Examiner* — Karen Kusumakar
(74) *Attorney, Agent, or Firm* — Weaver Austin Villeneuve & Sampson LLP

(57) ABSTRACT

Various embodiments herein relate to methods, apparatus, and systems for forming an interconnect structure, or a portion thereof, on a substrate. In one example, the method includes receiving the substrate in a processing chamber, the substrate having dielectric material exposed within recessed features formed therein; exposing the substrate to plasma to thereby modify a top surface of the dielectric material; forming a metal oxide barrier layer on the modified top surface of the dielectric material, wherein the metal oxide barrier layer is formed through atomic layer deposition
(Continued)

and/or chemical vapor deposition. In certain implementations, one or more additional step may be taken to improve processing results, for example to promote nucleation and/or adhesion of relevant layers.

30 Claims, 10 Drawing Sheets

(51) Int. Cl.

| | |
|---|---|
| *C23C 16/40* | (2006.01) |
| *C23C 16/455* | (2006.01) |
| *C23C 16/56* | (2006.01) |
| *H01J 37/32* | (2006.01) |
| *H10W 20/00* | (2026.01) |
| *H10W 20/41* | (2026.01) |

(52) U.S. Cl.
CPC .. *C23C 16/45536* (2013.01); *C23C 16/45553* (2013.01); *C23C 16/56* (2013.01); *H01J 37/32357* (2013.01); *H01J 37/32449* (2013.01); *H10W 20/042* (2026.01); *H10W 20/056* (2026.01); *H10W 20/076* (2026.01); *H10W 20/081* (2026.01); *H10W 20/096* (2026.01); *H10W 20/425* (2026.01); *H01J 2237/3321* (2013.01)

(58) Field of Classification Search
CPC ......... H01L 21/76871; H01L 21/76877; H01L 23/53238; H01L 23/53266; H01L 21/28562; H01L 21/76823; C23C 16/34; C23C 16/403; C23C 16/45536; C23C 16/45553; C23C 16/56; C23C 16/0245; C23C 16/40; H01J 37/32357; H01J 37/32449; H01J 2237/3321
See application file for complete search history.

(56) References Cited

U.S. PATENT DOCUMENTS

| | | | |
|---|---|---|---|
| 6,553,933 B2 | 4/2003 | Powell et al. | |
| 6,616,985 B2 | 9/2003 | Powell et al. | |
| 6,794,288 B1 | 9/2004 | Kolics et al. | |
| 6,878,402 B2 | 4/2005 | Chiang et al. | |
| 7,368,377 B2 | 5/2008 | Whelan et al. | |
| 7,727,882 B1 | 6/2010 | Wu et al. | |
| 8,192,806 B1 | 6/2012 | Varadarajan et al. | |
| 8,298,890 B1 * | 10/2012 | Kuse ................... | H10D 64/685 |
| | | | 438/257 |
| 9,224,594 B2 * | 12/2015 | Kashefi ............. | H01L 21/02301 |
| 9,418,889 B2 | 8/2016 | Mountsier et al. | |
| 2002/0155722 A1 | 10/2002 | Satta et al. | |
| 2008/0105979 A1 | 5/2008 | Whelan et al. | |
| 2008/0179741 A1 | 7/2008 | Streck et al. | |
| 2009/0163025 A1 | 6/2009 | Humayun et al. | |
| 2011/0163451 A1 * | 7/2011 | Matsumoto ............. | C23C 16/18 |
| | | | 438/653 |
| 2013/0330935 A1 | 12/2013 | Varadarajan | |
| 2015/0021773 A1 * | 1/2015 | Lee ................... | H01L 21/76898 |
| | | | 257/751 |

| | | | |
|---|---|---|---|
| 2015/0126027 A1 | 5/2015 | Matsumoto et al. | |
| 2015/0140834 A1 | 5/2015 | Kashefi et al. | |
| 2015/0179509 A1 | 6/2015 | Limdulpaiboon et al. | |
| 2015/0340323 A1 | 11/2015 | Cabral, Jr. et al. | |
| 2016/0276218 A1 | 9/2016 | Matsumoto et al. | |
| 2017/0005038 A1 | 1/2017 | Lee et al. | |
| 2018/0374747 A1 | 12/2018 | Joi et al. | |
| 2023/0298936 A1 | 9/2023 | Blakeney et al. | |

FOREIGN PATENT DOCUMENTS

| | | | |
|---|---|---|---|
| JP | 2008147252 A | 6/2008 | |
| KR | 20050063888 A | 6/2005 | |
| KR | 20090115190 A | 11/2009 | |
| KR | 20100107978 A | 10/2010 | |
| KR | 101214704 B1 | 12/2012 | |
| KR | 20130139188 A | 12/2013 | |
| KR | 20150092053 A | 8/2015 | |
| KR | 20200013262 A | 2/2020 | |
| KR | 20200014939 A | 2/2020 | |
| TW | 200605221 A | 2/2006 | |
| TW | 200732518 A | 9/2007 | |
| TW | 201409613 A | 3/2014 | |
| TW | 201532236 A | 8/2015 | |
| WO | WO-2020003000 A1 | 1/2020 | |
| WO | WO-2020006532 A1 | 1/2020 | |

OTHER PUBLICATIONS

International Search Report and Written Opinion dated Oct. 20, 2021, in application No. PCT/US2021/039189.
KR Office Action dated Feb. 12, 2022, in Application No. KR10-2015-0092053 with English translation.
U.S. Non-Final Office Action dated Jan. 15, 2016, in U.S. Appl. No. 14/742,180.
U.S. Notice of Allowance dated Apr. 28, 2016, in U.S. Appl. No. 14/742,180.
International Preliminary Report on Patentability dated Feb. 23, 2023 in PCT Application No. PCT/US2021/045436.
International Preliminary Report on Patentability dated Jan. 12, 2023, in PCT Application No. PCT/US2021/039189.
International Search Report and Written Opinion mailed on Dec. 2, 2021, in PCT Application No. PCT/US2021/045436.
KR Office Action dated Aug. 6, 2025 in KR Application No. 10-2022-7045907, with English Translation.
KR Office Action dated Dec. 15, 2023 in KR Application No. 10-2023-0072685, with English Translation.
KR Office Action dated Nov. 25, 2024 in KR Application No. 10-2023-0072685, with English Translation.
KR Office Action dated Sep. 22, 2025 in KR Application No. 10-2023-0072685, with English Translation.
TW Office Action dated Jan. 7, 2025 in TW Application No. 110123727 with English translation.
TW Office Action dated Sep. 8, 2025 in TW Application No. 110123727, with English Translation.
KR Office Action dated Nov. 13, 2025 in KR Application No. 10-2022-7046053, with English Translation.
U.S. Non-Final Office Action dated Nov. 5, 2025 in U.S. Appl. No. 18/041,391.

* cited by examiner

| Receive substrate with recessed features thereon | 301 |

| Simultaneously expose substrate to first and second reactants, and drive reaction between first and second reactants to cause deposition on substrate | 303 |

Receive substrate with exposed metal oxide barrier layer ～601

Expose substrate to reducing gas or plasma to reduce upper surface of metal oxide barrier layer to metal ～603

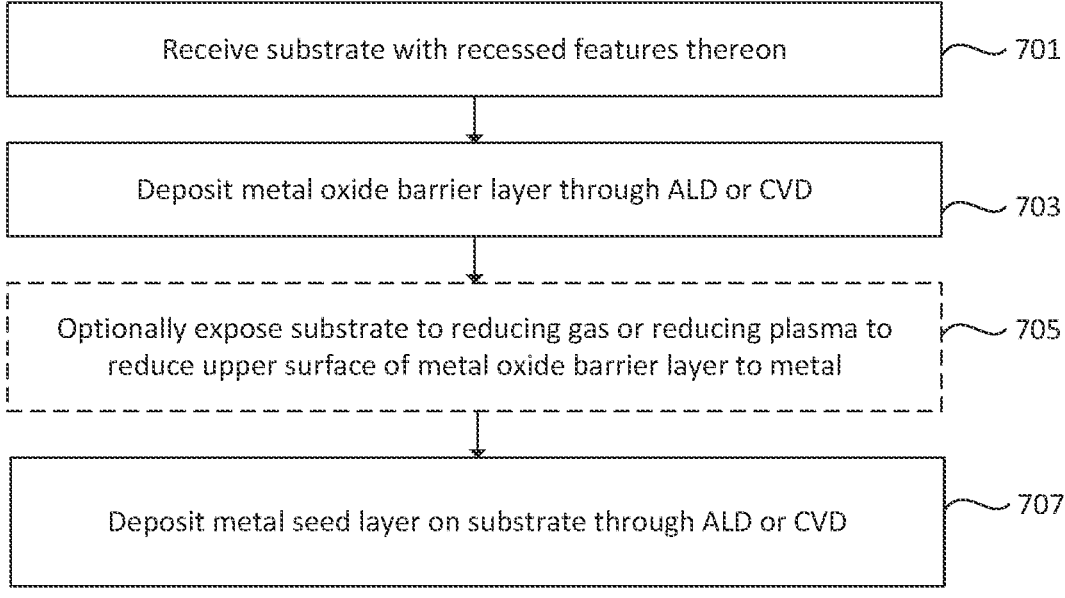

Receive substrate with recessed features thereon — 701

Deposit metal oxide barrier layer through ALD or CVD — 703

Optionally expose substrate to reducing gas or reducing plasma to reduce upper surface of metal oxide barrier layer to metal — 705

Deposit metal seed layer on substrate through ALD or CVD — 707

FIG. 7

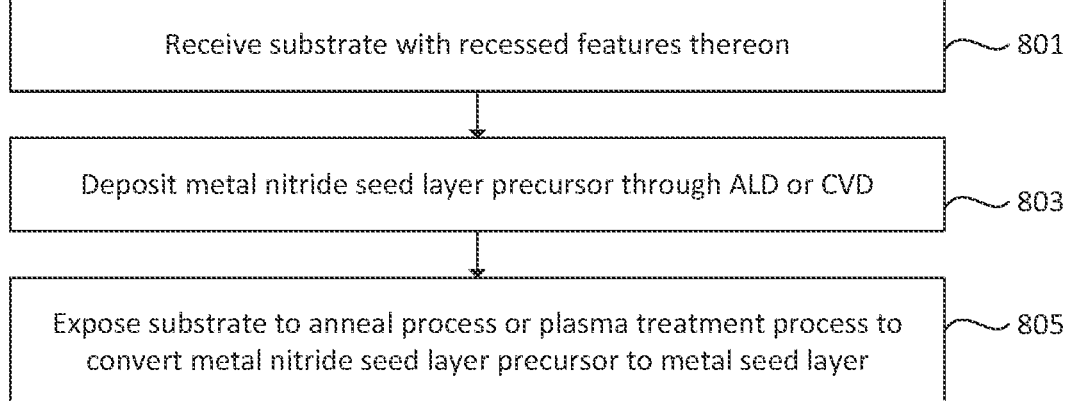

Receive substrate with recessed features thereon — 801

Deposit metal nitride seed layer precursor through ALD or CVD — 803

Expose substrate to anneal process or plasma treatment process to convert metal nitride seed layer precursor to metal seed layer — 805

FIG. 8

METAL OXIDE DIFFUSION BARRIERS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

As semiconductor device dimensions continue to shrink, fabrication of such devices becomes increasingly difficult. In many cases, existing processes are not capable of forming desired materials and structures within acceptable tolerances.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Various embodiments herein relate to methods, apparatus, and systems for forming an interconnect structure, or a portion thereof, on a substrate. The substrate may be a semiconductor wafer, for example. In one aspect of the disclosed embodiments, a method of forming an interconnect structure, or a portion thereof, on a substrate is provided, the method including: (a) receiving the substrate in a processing chamber, the substrate including dielectric material with recessed features formed in the dielectric material, where the interconnect structure is to be formed in the recessed features, where the dielectric material is exposed within the recessed features; (b) exposing the substrate to plasma to thereby modify a top surface of the dielectric material; and (c) after (b), forming a metal oxide barrier layer on the modified top surface of the dielectric material, where the metal oxide barrier layer is formed, at least in part, through atomic layer deposition and/or chemical vapor deposition.

In some embodiments, exposing the substrate to plasma in (b) roughens the top surface of the dielectric material. In these or other embodiments, exposing the substrate to plasma in (b) promotes nucleation of the metal oxide barrier layer in (c), and improves adhesion between the dielectric material and the metal oxide barrier layer. In these or other cases, exposing the substrate to plasma in (b) includes exposing the substrate to plasma generated from a process gas selected from the group consisting of: $H_2$, $O_2$, $NH_3$, $CO_2$, $N_2O$, $N_2$, and combinations thereof.

The metal oxide barrier layer may include various different metals such as manganese and/or any group 3-14 metal. In some embodiments, the metal oxide barrier layer includes a material selected from the group consisting of: aluminum oxide, copper oxide, indium oxide, magnesium oxide, manganese oxide, ruthenium oxide, tin oxide, titanium oxide, tungsten oxide, zinc oxide, and combinations thereof. In one example, the metal oxide barrier layer includes zinc oxide. In another example, the metal oxide barrier layer includes tin oxide.

The metal oxide barrier layer may be formed through various different types of reaction mechanisms. In some embodiments, the metal oxide barrier layer is formed through thermal atomic layer deposition or plasma enhanced atomic layer deposition. In some embodiments, the metal oxide barrier layer is formed through thermal chemical vapor deposition or plasma enhanced chemical vapor deposition. In some embodiments, forming the metal oxide barrier layer includes (i) forming a first portion of the metal oxide barrier layer through thermal atomic layer deposition or thermal chemical vapor deposition, and (ii) forming a second portion of the metal oxide barrier layer through plasma enhanced atomic layer deposition or plasma enhanced chemical vapor deposition, where the first portion of the metal oxide barrier layer is formed before the second portion of the metal oxide barrier layer.

The metal oxide barrier layer may be formed using a number of different metal-containing reactants. In some embodiments, the metal oxide barrier layer is formed using a metal-containing reactant selected from the group consisting of: a magnesium-containing reactant, a titanium-containing reactant, a molybdenum-containing reactant, a tungsten-containing reactant, a ruthenium-containing reactant, a cobalt-containing reactant, a copper-containing reactant, a zinc-containing reactant, an aluminum-containing reactant, an indium-containing reactant, a tin-containing reactant, a manganese-containing reactant, and combinations thereof. In various embodiments, the metal-containing reactant is selected from the group consisting of bis(1,4-di-bis(ethylcyclopentadienyl)magnesium, tert-butyl-diazadiene)magnesium, tetrakis(dimethylamido)titanium, dichlorodioxomolybdenum, hexachlorotungsten, dodecacarbonyltriruthenium, octacarbonyldicobalt, bis(dimethylamino-2-propoxy)copper, bis(dimethylaminoethoxy)copper, bis(diethylamino-2-propoxy)copper, bis(ethylmethylamino-2-propoxy)copper, bis(dimethylamino-2-methyl-2-butoxy)copper, bis(N,N'-di-sec-butylacetamidinate)dicopper, dimethylzinc, diethylzinc, diallylzinc, bis(2-methylallyl)zinc, trimethylaluminum, trimethylindium, tetrakis(dimethylamido)tin, tin(IV) chloride, tin(IV) chloride, tin(IV) bromide, stannane, trimethyltin chloride, dimethyltin dichloride, methyltin trichloride, tetraethyltin, tetramethyltin, dibutyltin diacetate, (dimethylamino)trimethyltin(IV), bis[bis(trimethylsilyl)amino]tin(II), dibutyldiphenyltin, hexaphenylditin(IV), tetraallyltin, tetrakis(diethylamino)tin(IV), tetravineyltin, tin(II)acetylacetonate, tricyclohexyltin hydride, trimethyl(phenylethynyl)tin, trimethyl(phenyl)tin, tetrakis(ethylmethylamino)tin, tin(II)(1,3-bis(1,1-dimethylethyl)-4,5-dimethyl-(4R,5R)-1,3,2-diazastannolidin-2-ylidene, $N^2,N^3$-di-tert-butyl-butane-2,4-diamino-tin(II), bis(cyclopentadienyl)manganese, bis(ethylcyclopentadienyl)manganese, bis(tetramethylcyclopentadienyl)manganese, bis(pentamethylcyclopentadienylmanganese, bis(1,4-di-tert-butyl-diazadiene)manganese, bis(bis(trimethylsilylamido))manganese, bis(bis(ethyldimethylsilylamido))manganese, bis(N,N'-diisopropylpentylamidinato)manganese, and combinations thereof.

In certain implementations, the method may further include after (c), exposing the substrate to a reducing gas, thereby reducing a top surface of the metal oxide barrier layer and forming an in-situ metal liner on the metal oxide barrier layer. In these or other implementations, the method may further include after (c), exposing the substrate to a reducing plasma generated from a reducing gas, thereby reducing a top surface of the metal oxide barrier layer and forming an in-situ metal liner on the metal oxide barrier layer. In some embodiments, exposing the substrate to the reducing gas or the reducing plasma improves adhesion of a subsequently deposited layer. For example, the subsequently deposited layer may be a metal seed layer or a metal nitride seed layer precursor. The reducing gas may include $H_2$ and/or a molecule that includes both nitrogen and hydrogen.

In some embodiments, the method may further include after (c), forming a metal seed layer or a metal nitride seed layer precursor on the substrate through atomic layer deposition or chemical vapor deposition. The metal layer or metal nitride seed layer precursor may include a metal selected from the group consisting of: copper, cobalt, iridium, molybdenum, palladium, ruthenium, tungsten, and combinations thereof. In certain embodiments, the metal seed layer or metal nitride seed layer precursor are deposited using a metal-containing reactant selected from the group consisting of: a molybdenum-containing reactant, a tungsten-containing reactant, a ruthenium-containing reactant, a cobalt-containing reactant, an iridium-containing reactant, a copper-containing reactant, a palladium-containing reactant, and combinations thereof. In various embodiments, the metal-containing reactant is selected from the group consisting of dichlorodioxomolybdenum, pentachloromolybdenum, hexafluoromolybdenum, hexafluorotungsten, hexachlorotungsten, pentachlorotungsten, bis(tert-butylimido) bis(dimethylamido)tungsten, dodecacarbonyltriruthenium, (2,4-dimethylpentadienyl)ethylcyclopentadienylruthenium, (1-ethyl-1,4-cyclohexadienyl)ethylbenzeneruthenium, bis (ethylcyclopentadienyl)ruthenium, tetraoxoruthenium, octacarbonyldicobalt, (2-tert-butylallyl)tricarbonylcobalt, (3,3-dimethyl-1-butyne)hexacarbonyldicobalt, cyclopentadienyldicarbonylcobalt, bis(1,4-diisopropyl-diazadiene)cobalt, bis(1,4-di-tert-butyl-diazadiene)cobalt, bis (N,N'-diisopropylacetamidinato)cobalt, bis(N-tert-butyl-N'-ethylpropanimidamidinato)cobalt, tris(acetylacetonate) iridium, bis(dimethylamino-2-propoxy)copper, bis (dimethylaminoethoxy)copper, bis(diethylamino-2-propoxy)copper, bis(ethylmethylamino-2-propoxy)copper, bis(dimethylamino-2-methyl-2-butoxy)copper bis(N,N'-di-sec-butylacetamidinate)dicopper, 1-methylallyl(hexafluoro-acetylacetonato)-palladium(II), bis(hexafluoroacetylaceto-nato)palladium, and combinations thereof. In some embodiments, the method may further include forming a liner on the metal oxide barrier layer through atomic layer deposition and/or chemical vapor deposition, where the liner is formed prior to formation of the metal seed layer or the metal nitride seed layer precursor. In these or other embodiments, the method may further include exposing the substrate to an anneal process or a plasma treatment process to thereby convert the metal nitride seed layer precursor to the metal seed layer. The anneal process or the plasma treatment process may convert a copper nitride seed layer precursor to a copper seed layer.

In various embodiments, forming the metal oxide barrier layer in (c) comprises (i) forming a barrier layer precursor comprising at least one material selected from the group consisting of an elemental metal, a metal carbide, and a metal nitride, wherein the barrier layer precursor is formed through atomic layer deposition and/or chemical vapor deposition, and (ii) exposing the barrier layer precursor to an oxygen-containing atmosphere to thereby convert the barrier layer precursor to the metal oxide barrier layer.

In a further aspect of the disclosed embodiments, a system for forming an interconnect structure, or a portion thereof, on a substrate is provided, the system including: (a) one or more processing chambers; and (b) a controller having at least one processor and a memory, where the at least one processor and the memory are communicatively connected with one another, and the memory stores computer-executable instructions for controlling the at least one processor to cause any of the methods described herein.

In a further aspect of the disclosed embodiments, a system for processing substrates is provided, the system including: a first processing chamber; and a controller having at least one processor and a memory, where the at least one processor and the memory are communicatively connected with one another, and the memory stores computer-executable instructions for controlling the at least one processor to cause: receiving the substrate in the first processing chamber, the substrate including dielectric material with recessed features formed in the dielectric material, where the interconnect structure is to be formed in the recessed features, where the dielectric material is exposed within the recessed features, exposing the substrate to plasma in the first processing chamber to thereby modify a top surface of the dielectric material, and after (ii), forming a metal oxide barrier layer on the modified top surface of the dielectric material, where the metal oxide barrier layer is formed, at least in part, through atomic layer deposition and/or chemical vapor deposition.

In some embodiments, the system may further include a second processing chamber, where the memory stores computer-executable instructions for controlling the at least one processor to cause, transferring the substrate from the first processing chamber to the second processing chamber, and forming a metal seed layer or a metal nitride seed layer precursor on the metal oxide barrier layer through atomic layer deposition and/or chemical vapor deposition while the substrate is positioned in the second processing chamber. In some embodiments, the memory may store computer-executable instructions for controlling the at least one processor to cause: prior to forming the metal seed layer or the metal nitride seed layer precursor, exposing the substrate to a reducing gas or a reducing plasma in the second processing chamber, thereby reducing an upper surface of the metal oxide barrier layer and forming an in-situ metal liner, where the metal seed layer or metal nitride seed layer precursor forms on the in-situ metal liner. In certain implementations, the substrate is not exposed to atmosphere between exposing the substrate to the reducing gas or the reducing plasma and forming the metal seed layer or the metal nitride seed layer precursor. In some implementations, the memory may store computer-executable instructions for controlling the at least one processor to cause: exposing the substrate to an anneal process or a plasma treatment process to thereby convert the metal nitride seed layer precursor to the metal seed layer.

The first and second processing chambers may be further configured to perform additional functions. For example, in some embodiments at least one of the first and second processing chambers is configured to deposit a liner on the metal oxide barrier layer, the liner being deposited through atomic layer deposition and/or chemical vapor deposition.

In some embodiments, the first processing chamber is positioned on a first apparatus and the second processing chamber is positioned on a second apparatus. In these or other embodiments, the system may further include a third processing chamber, where the memory stores computer-executable instructions for controlling the at least one processor to cause: transferring the substrate from the second processing chamber to the third processing chamber and electroplating metal onto the metal seed layer while the substrate is in the third processing chamber. In some embodiments, the second processing chamber and the third processing chamber are each part of the second apparatus. In some such embodiments, the memory may store computer-executable instructions for controlling the at least one processor to cause: transferring the substrate from the second processing chamber to the third processing chamber without exposing the substrate to atmosphere. In certain embodiments, the memory may store computer-executable instructions for controlling the at least one processor to cause: exposing the substrate to atmosphere while transferring the substrate from the first processing chamber to the second processing chamber.

In various embodiments, the memory stores computer-executable instructions for controlling the at least one processor to cause: forming the metal oxide barrier layer by (i) forming a barrier layer precursor comprising at least one material selected from the group consisting of a metal, a metal carbide, and a metal nitride, where the barrier layer precursor is formed through atomic layer deposition and/or chemical vapor deposition, and (ii) exposing the barrier layer precursor to an oxygen-containing atmosphere to thereby convert the barrier layer precursor to the metal oxide barrier layer.

These and other aspects are described further below with reference to the drawings.

BRIEF DESCRIPTION OF THE DRAWINGS

FIG. 7 is a flow chart describing a method of depositing a metal oxide barrier layer and seed layer.

FIG. 8 is a flow chart describing a method of depositing a metal nitride seed layer precursor and converting it to a metal seed layer.

DETAILED DESCRIPTION

In the following description, numerous specific details are set forth to provide a thorough understanding of the pre-sented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Figure 1:
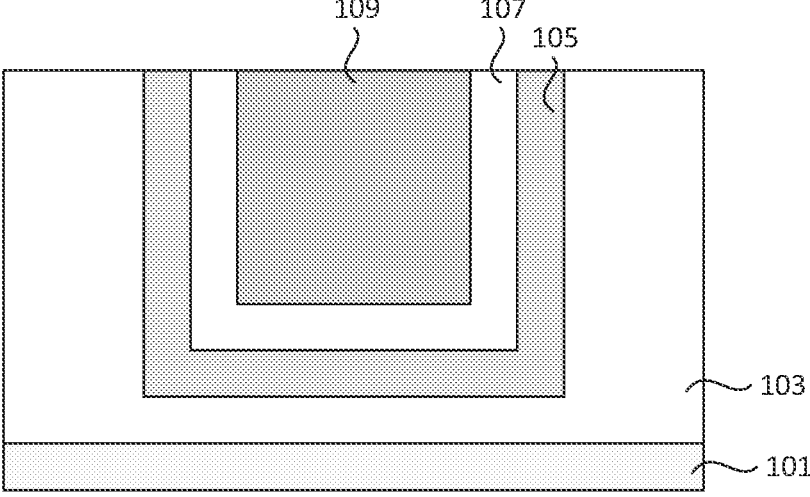
FIG. 1 depicts an interconnect structure according to various embodiments.

One of the processes involved in back-end-of-line (BEOL) semiconductor fabrication is the formation of interconnects that electrically connect two or more circuit elements together. FIG. 1 illustrates an example of a substrate 101 with an interconnect structure formed thereon. The substrate 101 has dielectric material 103 thereon, which has been etched to form a recessed feature. Within the recessed feature, a barrier layer 105 is present on the dielectric material 103. An optional liner 107 may be present on the barrier layer 105. Conducting metal 109 is present on the optional liner 107 or on the barrier layer 105. The conducting metal 109 functions as an interconnect.

Generally speaking, there is a widely used industry standard for forming the interconnect structure shown in FIG. 1 (e.g., for metallizing BEOL interconnects). This industry standard utilizes a specific stack of materials that are manufactured by processes that have been proven to result in low defects both immediately after manufacture and over time. However, as device dimensions continue to shrink, the industry standard stack is beginning to occupy too much of the available interconnect volume, resulting in line resistances which are too high. However, due to various constraints, it can be difficult to modify the industry standard stack.

For example, the dielectric material 103 should have low permittivity and an associated low dielectric constant (K) to minimize RC delay of the circuit. As used herein, a material with a dielectric constant of about 3.7 or less is considered a low-k material. The dielectric material 103 should also be readily etched in order to form the relevant circuitry, and should have sufficient mechanical strength to resist pattern collapse after etching.

The barrier layer 105 is provided to minimize or eliminate diffusion of conductive metal 109 into dielectric material 103. Without a barrier layer 105, the conducting metal 109 will typically diffuse into the dielectric material 103, which results in a decrease of the dielectric constant and eventually short-circuiting of the interconnects. The barrier layer 105 should therefore be effective in preventing diffusion of the conductor metal 109. Further, it should have good adhesion to the dielectric material 103 and to the optional liner 107 or to the conductive metal 109 itself (or a seed layer used to form the conductive metal 109). It is desirable for the barrier layer 105 to be as thin and conductive as possible. The process used to form the barrier layer 105 should exhibit good nucleation on the dielectric material 103, should produce a continuous film with few or no defects that would compromise the barrier layer's ability to prevent metal diffusion, and should produce nearly conformal step coverage to prevent pinching off narrow features. For commercial processing, few barrier materials have been able to satisfy these constraints. In some cases, stacks of tantalum/tantalum nitride are used as a barrier layer 105. In some limited cases, stacks of titanium/titanium nitride are used as a barrier layer 105. Physical vapor deposition (PVD) or reactive sputtering are commonly used to deposit these materials to thereby form the barrier layer 105.

The optional liner 107 may be provided between the barrier layer 105 and the conductive metal 109. When present, the liner 107 may mitigate a shortcoming of the barrier layer 105. For instance, if the barrier layer 105 does not have sufficient adhesion to the conductive metal 109, the liner 107 may be provided to ensure adequate adhesion between relevant layers (e.g., between the barrier layer 105 and the liner 107, and between the liner 107 and the conductive metal 109). In some cases, a cobalt liner is used, for example between a tantalum nitride barrier layer and copper.

A seed layer (not shown in FIG. 1) may be provided on the barrier layer 105 or on the optional liner 107 in some cases. The seed layer is conductive and may be made of the same material as the bulk conductive metal 109, or a different material. The seed layer enables subsequent deposition of the bulk conductor metal 109. In some cases, another layer in the stack (e.g., barrier layer 105 or optional liner 107) is sufficiently conductive such that no additional seed layer is needed. In conventional processing, seed layers are typically formed through physical vapor deposition.

The conductive metal 109 acts as an interconnect to electrically connect different devices on the substrate 101. The conductive metal 109 is typically formed through electrodeposition, which provides good filling properties at relatively low cost. The conductive metal 109 fills the volume of the recessed feature that is not occupied by the other layers mentioned above.

Each of the stack components described above presents several constraints regarding material properties, interfacial properties, etc. As such, a change to any individual component within the stack can cause significant issues with regard to the rest of the stack. With regard to the barrier layer, metals and metal nitrides have commonly been used. Metal oxides have been viewed as unsuitable to serve as barrier layers in the context of back-end-of-line interconnect structures. One reason they were seen as unsuitable is because the thicknesses required have been too high relative to other materials/approaches. Another reason they were seen as unsuitable is many metal oxides are highly electrically resistive. Because barrier layer materials should be as conductive as possible, highly resistive metal oxides are poor candidates for barrier layer materials. Further, metal oxides have shown relatively poor nucleation on and adhesion to the underlying dielectric materials.

However, the inventors have discovered that certain metal oxides can function as barrier layer materials in the context of back-end-of-line interconnect structures. Such metal oxides may be relatively conductive, and can be deposited at high quality in reasonably thin layers using atomic layer deposition or chemical vapor deposition. These deposition processes may be enabled by the use of pre-treatments to condition the surface of the dielectric material, for example to promote improved nucleation/adhesion between the dielectric material and the barrier layer. In various embodiments herein, one or more additional steps may be taken to promote adhesion between other layers in the interconnect structure, for example between a metal oxide barrier layer and a subsequently deposited layer such as a liner, seed layer, or conductive metal, and/or between a seed layer and a subsequently deposited conductive metal.

I. Plasma Pre-treatment to Promote Nucleation and Adhesion on Dielectric Material In the context of commercial interconnect formation, the use of plasma processing directly on low-k dielectric material has been avoided because the plasma quickly modifies/damages the exposed dielectric material. For example, the dielectric material is frequently doped with carbon, which dramatically decreases the dielectric constant of the dielectric material. Upon exposure to plasma, this carbon is removed from the dielectric material, thereby causing an undesirable increase in its dielectric constant. In other words, the dramatic decrease in dielectric constant enabled by carbon doping is lost upon exposure of the dielectric material to plasma.

However, the inventors have found that a small amount of modification/damage to the dielectric is acceptable, and further, such damage can be beneficial in terms of promoting high quality nucleation/adhesion during deposition of a subsequent layer. For instance, the plasma pre-treatment may act to roughen the surface of the dielectric, thereby increasing its surface area. This increased surface area improves adhesion to a subsequently deposited layer. Further, the plasma pre-treatment can be carefully controlled such that only the top surface of the dielectric material is affected. This ensures that the bulk properties of the dielectric material remain largely unaffected.

Figure 2:
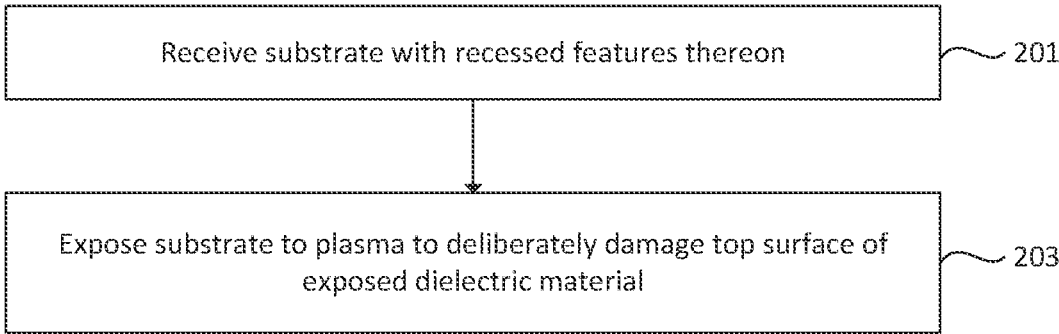
FIG. 2 is a flow chart describing a method of pre-treating a substrate with plasma to modify exposed dielectric and promote improved adhesion.

FIG. 2 presents a flow chart for a method of pre-treating a semiconductor substrate to promote nucleation and adhesion on exposed dielectric material. The method starts with operation 201, where the substrate is received in a reaction chamber. The substrate includes dielectric material exposed on its surface, with recessed features formed in the dielectric material. At operation 203, the substrate is exposed to plasma. The plasma deliberately damages the top surface of the exposed dielectric material. For example, the plasma may act to volatilize or otherwise remove a dopant (e.g., carbon) from the top surface of the dielectric material. The plasma may also act to roughen the top surface of the dielectric material. Operation 203 may be followed by deposition of a metal oxide barrier layer, as discussed further below.

Any type of plasma may be used in operation 203. In various embodiments, the plasma may be an inductively coupled plasma, a capacitively coupled plasma, a microwave plasma, etc. The plasma may be generated remotely from the substrate (e.g., in a plasma generation chamber or region which is shielded from the substrate), or it may be generated in the same reaction chamber/region in which the substrate is provided, such that the substrate is directly exposed to the plasma.

In various embodiments, the plasma pre-treatment may be relatively short and/or gentle to ensure that the plasma damage is limited to the top surface of the dielectric material. Generally, shorter plasma exposure durations enable relatively harsher plasma conditions. In various embodiments, the substrate may be exposed to the plasma pre-treatment for a duration between about 0-60 seconds. In some cases, the duration is at least about 1 second, at least about 5 seconds, at least about 10 seconds, at least about 20 seconds, at least about 30 seconds, or at least about 45 seconds. In these or other cases, the duration may be about 60 seconds or less, about 45 seconds or less, about 30 seconds or less, about 20 seconds or less, about 10 seconds or less, or about 5 seconds or less. These minimum and maximum durations may be combined as desired for a particular application.

The plasma used to pre-treat the dielectric material may be generated from a number of possible species, as discussed further below in the section related to Reactants and Other Processing Gases.

The plasma used to pre-treat the dielectric material may be generated under a wide set of conditions. Generally, the conditions are designed such that only the top surface of the dielectric is affected. As mentioned above, relatively harsher plasma conditions may be combined with relatively shorter exposure durations, while relatively milder plasma conditions may be combined with relatively longer exposure durations. In various embodiments, the plasma may be generated at an RF power between about 0.2-3 KW. This refers to the power provided to process a single 300 mm substrate, and can be scaled accordingly. The plasma may be generated at one or more frequencies, for example at 13.56 kHz and/or 100 kHz. The plasma may have a duty cycle between about 100% and 1%. A pressure in the reaction chamber may be maintained between about $10^{-8}$ Torr to 760 Torr. The support on which the substrate is positioned may be maintained at a temperature between about 0-400° C.

In one example where a relatively short/harsh plasma pre-treatment is used, the plasma may be generated at an RF power between about 0.6-3 KW and exposed to the substrate for a duration between about 1-20 seconds. In another example where a relatively long/gentle plasma pre-treatment is used, the plasma may be generated at an RF power between about 0.2-0.6 kW, and exposed to the substrate for a duration between about 10-60 seconds.

Because the plasma pre-treatment is designed to only affect the top surface of the dielectric material, the bulk properties of the dielectric material are largely unaffected. In various embodiments, the plasma pre-treatment only affects the upper 1 nm of the dielectric material. For instance, during the plasma pre-treatment, carbon (or other dopant) may be removed only in this upper region of the dielectric material. After the plasma pre-treatment, the bulk dielectric material may still have a dielectric constant of about 3.7 or lower.

The plasma pre-treatment on the dielectric material significantly improves adhesion between the pre-treated dielectric material and subsequently deposited metal oxide barrier layer material.

II. Deposition of Metal Oxide Barrier Layer

Metal oxides have not been used commercially as barrier layers in the context of back-end-of-line interconnect structures for the reasons discussed above. However, the inventors have discovered that certain conductive metal oxides can function as barrier layers in this context. Such metal oxides may present advantages over conventional barrier layer materials such as metals and metal nitrides, for example because the metal oxides do not need to be protected from atmosphere during substrate processing and transfer operations. While exposed metals and metal nitrides may react with oxygen in the atmosphere, thereby changing the substrate surface, no such changes occur when a metal oxide is exposed to atmosphere because the metal oxide is already oxidized. As such, the use of metal oxide barrier layers may simplify substrate transfer operations (e.g., between an apparatus used to deposit the barrier layer and an apparatus used to deposit a subsequent layer such as a liner, seed layer, or conductive metal) and the equipment needed to effect such transfers.

Conventional barrier layers are usually deposited through physical vapor deposition. Unfortunately, conventional physical vapor deposition processes are not particularly conformal, and can block, pinch, or otherwise cause poor fill in certain features. By contrast, the barrier layers described herein are formed through atomic layer deposition (ALD) and/or chemical vapor deposition (CVD). Unless otherwise stated, the terms ALD and CVD as used herein are intended to cover both thermal processes and plasma-based processes. ALD and CVD processes can be controlled to produce high quality films that are very thin and conformal. The use of ALD and CVD to deposit the barrier layer is a significant improvement.

Previously, ALD and CVD have been avoided when depositing material (e.g., barrier layer material) on low-k dielectric. Such processes have not been widely used because they typically exhibit poor nucleation on dielectric materials, and as a result there is poor adhesion between the dielectric material and the subsequently deposited barrier layer. However, the pre-treatment step described above (e.g., pre-treating the dielectric material with plasma to deliberately damage the upper surface of the dielectric material) substantially improves the nucleation on the dielectric material when the barrier layer is deposited. This improvement in nucleation results in significantly improved adhesion between the dielectric material and the barrier layer.

Figure 3:
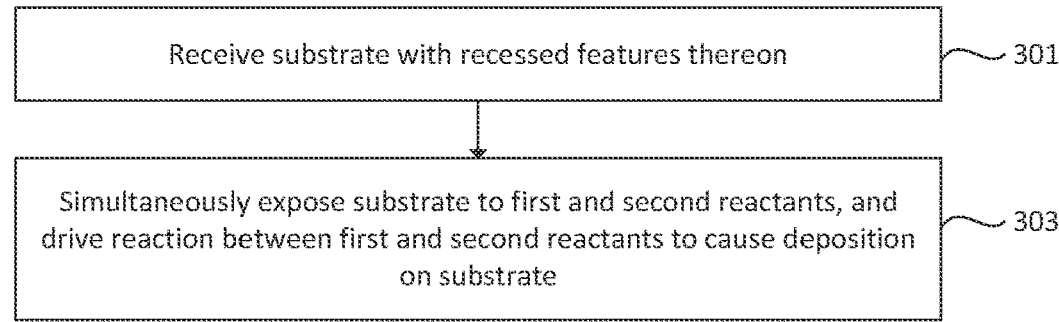
FIG. 3 is a flow chart describing a method of depositing a material using chemical vapor deposition.

FIG. 3 presents a flow chart describing a method of depositing a material using CVD. The method of FIG. 3 may begin after the method of FIG. 2 (e.g., after the dielectric material on the substrate is pre-treated through exposure to plasma). The method of FIG. 3 starts at operation 301, where a substrate is provided in a reaction chamber. Where the CVD process is used to deposit a metal oxide barrier layer, the substrate received in operation 301 includes dielectric material exposed on its surface, with recessed features formed in the dielectric material. An upper surface of the dielectric material may be deliberately damaged, for example as a result of exposure to the plasma pre-treatment process described above. At operation 303, the substrate is simultaneously exposed to a first reactant and a second reactant. A gas phase reaction is driven between the first reactant and the second reactant, which deposits a material on the substrate surface. Where the CVD process is used to deposit a metal oxide barrier layer, the first reactant may be a metal-containing reactant and the second reactant may be an oxygen-containing reactant. Example reactants are further discussed below in the section related to Reactants and Other Processing Gases. Where the energy used to drive the reaction is thermal, the process is referred to as thermal CVD. By contrast, where the energy used to drive the reaction is plasma energy, the process is referred to as plasma enhanced CVD. Any type of plasma may be used to deposit the metal oxide barrier layer.

Example processing conditions for forming a metal oxide barrier layer through thermal CVD may be as follows. The support on which the substrate is positioned may be controlled to a temperature between about 50 to 400° C. A pressure in the reaction chamber may be maintained between about $10^{-8}$ Torr to 760 Torr. The metal-containing reactant may flow at a rate between about 0.1-1000 sccm. The oxygen-containing reactant may flow at a rate between about 0.1-1000 sccm. The reaction may occur for a duration between about 1 second to 5 minutes. Example thicknesses for the metal oxide barrier layer are discussed further below, but may generally be in the range of about 0.25-2 nm.

Example processing conditions for forming a metal oxide barrier layer through plasma enhanced CVD may as follows. The support on which the substrate is positioned may be controlled to a temperature between about 0 to 400° C. A pressure in the reaction chamber may be maintained between about 108 Torr to 760 Torr. The metal-containing reactant may flow at a rate between about 0.1-1000 sccm. The oxygen-containing reactant may flow at a rate between about 0.1-1000 sccm. The reaction may occur for a duration between about 1 second to 5 minutes. The plasma may be any kind of plasma. The plasma may be generated at an RF power between about 0.2-3 KW. The plasma may be generated at one or more frequencies, for example at 13.56 kHz and/or at 100 kHz. The plasma may have a duty cycle between about 100% to 1%. Example thicknesses for the metal oxide barrier layer are discussed further below, but may generally be in the range of about 0.25-2 nm.

Figure 4:
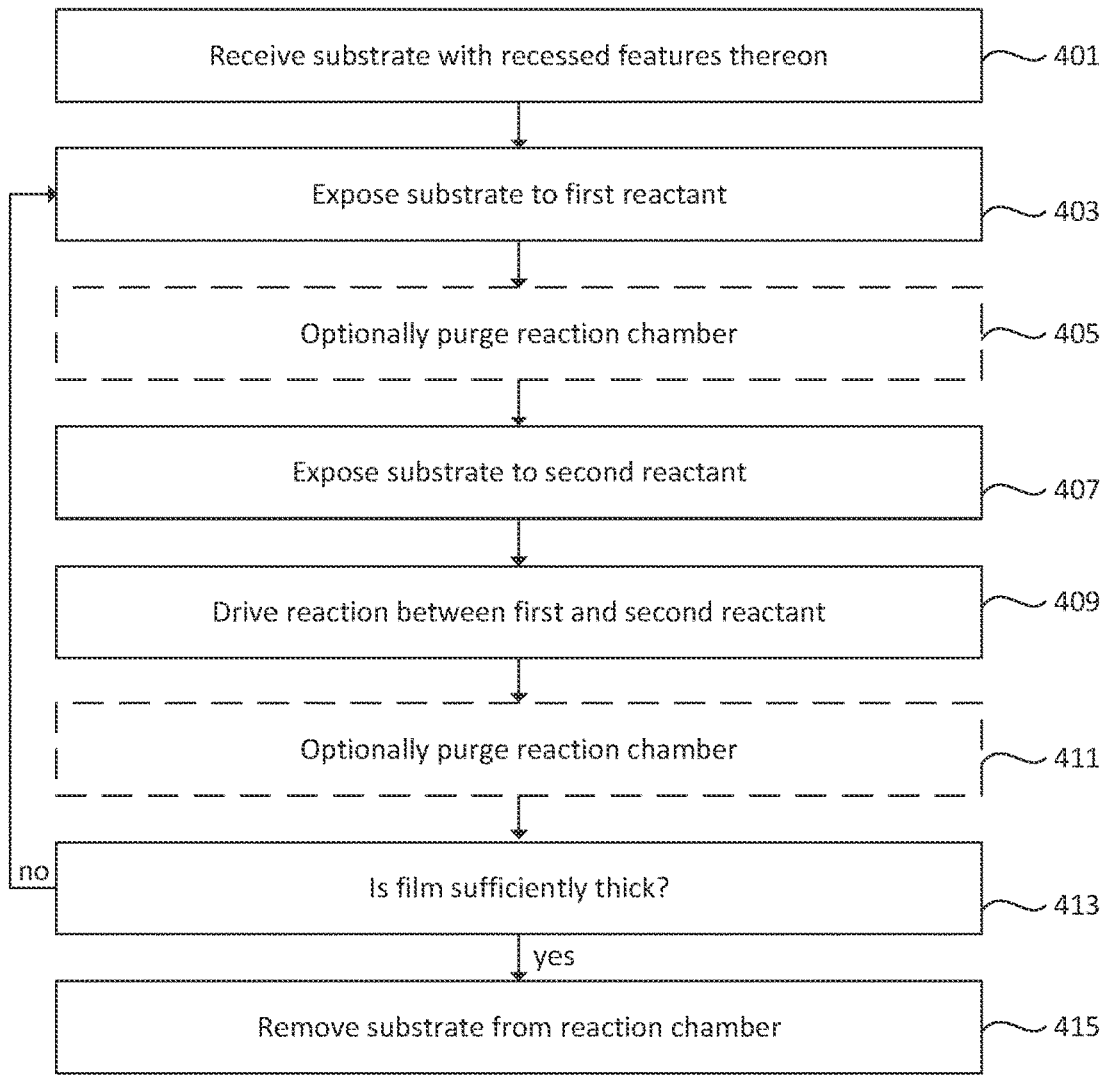
FIG. 4 is a flow chart describing a method of depositing a material using atomic layer deposition.

FIG. 4 presents a flow chart describing a method of depositing a material using ALD. The method begins at operation 401, where the substrate is received in the reaction chamber. The substrate may be as described in relation to FIG. 3. At operation 403, the substrate is exposed to a first reactant. The first reactant is allowed to adsorb onto the surface of the substrate. Next, at operation 405, the reaction chamber is optionally purged and/or evacuated to remove unbound first reactant. At operation 407, the substrate is exposed to a second reactant. The second reactant may be allowed to adsorb onto the surface of the substrate. In cases where the ALD technique is used to deposit a metal oxide barrier layer, the first reactant may be a metal-containing reactant and the second reactant may be an oxygen-containing reactant. Example reactants are further discussed below. At operation 409, a surface reaction is driven between the first and second reactants. The reaction may be driven by thermal energy (e.g., thermal ALD) or by plasma energy (e.g., plasma enhanced ALD). At operation 411, the reaction chamber is optionally purged and/or evacuated. Next, at operation 413, it is determined whether the film is sufficiently thick. Because ALD builds up film thickness on a layer-by-layer cyclic basis, many cycles are typically used to reach the desired film thickness. When it is determined that the film is not yet sufficiently thick, the method repeats starting at operation 403. When it is determined that the film has reached a sufficient thickness, the method continues with operation 415, where the substrate may be removed from the reaction chamber. Alternatively, the substrate may be subjected to further processing in the reaction chamber at operation 415. It is understood that the ALD deposition is essentially complete once it is determined in operation 413 that the film has reached a sufficient thickness.

In some cases, two or more of the operations shown in FIG. 3 may overlap in time. For example, operations 407 and 409 may overlap in time. Further, the purge described in operation 411 may occur at a different time, for example between operations 407 and 409, or during operation 409.

Example processing conditions for forming a metal oxide barrier layer through thermal ALD may as follows. The support on which the substrate is positioned may be controlled to a temperature between about 50-400° C. A pressure in the reaction chamber may be maintained between about $10^{-8}$ Torr to 760 Torr. The metal-containing reactant may flow at a rate between about 0.1-1000 sccm, for a duration between about 1-60 seconds. A purge gas may flow at a rate between about 0.1-1000 sccm, for a duration between about 1-60 seconds. The oxygen-containing reactant may flow at a rate between about 0.1-1000 sccm, for a duration between about 1-60 seconds. Example thicknesses for the metal oxide barrier layer are discussed further below, but may generally be in the range of about 0.25-2 nm.

Example processing conditions for forming a metal oxide barrier layer through plasma enhanced ALD may as follows. The support on which the substrate is positioned may be controlled to a temperature between about 0-400° C. A pressure in the reaction chamber may be maintained between about $10^{-8}$ Torr to 760 Torr. The metal-containing reactant may flow at a rate between about 0.1-1000 sccm, for a duration between about 1-60 seconds. A purge gas may flow at a rate between about 0.1-1000 sccm, for a duration between about 1-60 seconds. The oxygen-containing reactant may flow at a rate between about 0.1-1000 sccm, for a duration between about 1-60 seconds. The substrate may be exposed to plasma for duration between about 1-60 seconds. The plasma may be any kind of plasma. The plasma may be generated at an RF power between about 0.2-3 KW. The plasma may be generated at one or more frequencies, for example at 13.56 kHz and/or at 100 kHz. The plasma may have a duty cycle between about 100% to 1%. Example thicknesses for the metal oxide barrier layer are discussed further below, but may generally be in the range of about 0.25-2 nm.

The methods described in FIGS. 3 and 4 may be used to form the metal oxide barrier layer. In some cases, the methods described in FIGS. 3 and 4 may be used to form an additional material in the interconnect structure, for example a seed layer or a seed layer precursor, as discussed further below.

In some cases, the barrier layer may be deposited through two or more different techniques, with a first (e.g., lower) part of the barrier layer being deposited through a first technique and a second (e.g., upper) part of the barrier layer being deposited through a second technique. Each of the first and second techniques may be independently selected from thermal ALD, plasma enhanced ALD, thermal CVD, and plasma enhanced CVD. In a particular example, the first part of the barrier layer is deposited through thermal ALD and the second part of the barrier layer is deposited through plasma enhanced ALD. In another example, the first part of the barrier layer is deposited through thermal CVD and the second part of the barrier layer is deposited through plasma enhanced CVD. In another example, the first part of the barrier layer is deposited through thermal ALD and the second part of the barrier layer is deposited through plasma enhanced CVD. In another example, the first part of the barrier layer is deposited through thermal CVD and the second part of the barrier layer is deposited through plasma enhanced ALD. Other combinations are possible, as well.

It may be particularly advantageous to deposit the first part of the barrier layer using thermal techniques, rather than plasma techniques, to avoid damaging the underlying dielectric material. Similarly, it may be advantageous to deposit the second part of the barrier layer using plasma enhanced techniques, rather than thermal techniques, to minimize the thermal load on the substrate and to produce a high-quality, continuous barrier layer. Where the first part of the barrier layer is deposited using thermal techniques and the second part of the barrier layer is deposited using plasma enhanced techniques, the thermally deposited first part of the barrier layer acts to protect the underlying dielectric material from damage during the plasma processing to form the second part of the barrier layer.

In some embodiments, the barrier layer may be deposited through two or more different techniques, with a first technique used to deposit a barrier layer precursor, and a second technique used to modify the barrier layer precursor and form the metal oxide barrier layer. For example, the barrier layer precursor may be a layer of metal, metal carbide, metal nitride, etc., which may be deposited through any of the ALD and/or CVD techniques described herein. After the barrier layer precursor is deposited, it may be modified through exposure to an oxygen-containing atmosphere and/or oxygen-containing plasma.

The ideal thickness for the barrier layer will depend on the materials that are present in the interconnect structure, as well as the processing conditions to which these materials are subjected. The metal oxide barrier layer may have a thickness of at least about 0.25 nm, or at least about 0.5 nm. In these or other cases, the metal oxide barrier layer may have a thickness of about 2 nm or less, or about 1 nm or less.

Figures 5, 6:
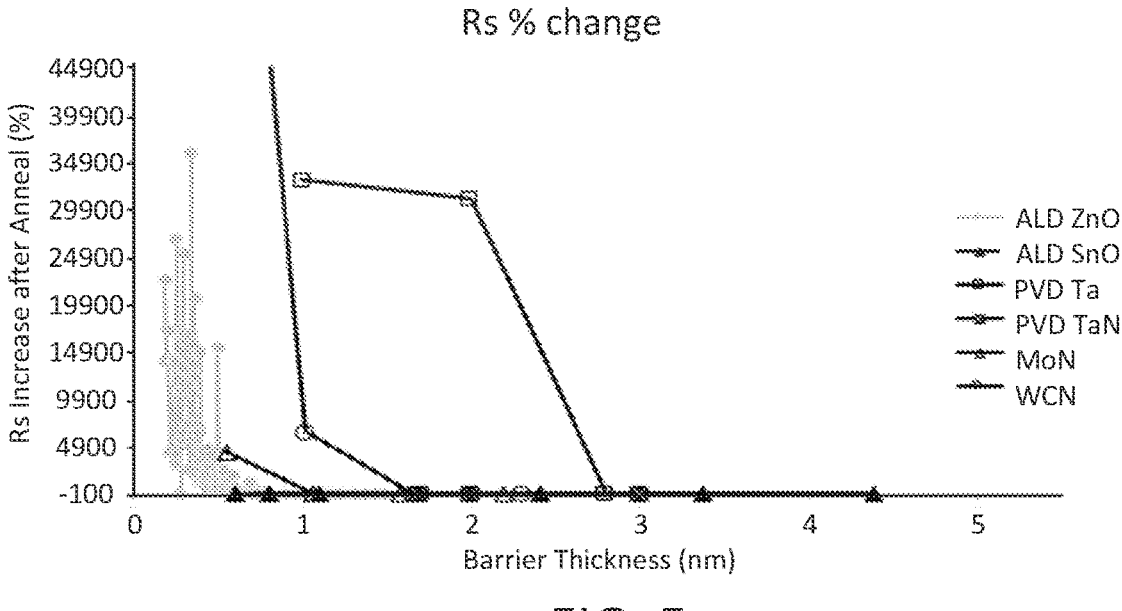
FIG. 5 is a graph depicting experimental results examining the effectiveness of various diffusion barrier layers.
FIG. 6 is a flow chart describing a method of processing a substrate using a reducing gas or reducing plasma to reduce an upper surface of a metal oxide barrier layer to metal.

FIG. 5 presents experimental results showing the effectiveness of different barrier layer materials at different thicknesses. In this experiment, various barrier layers of different materials and thicknesses were deposited on bare silicon wafers, and a copper layer was deposited on top of each barrier layer. The silicon wafer, barrier layer, and copper layer formed a stack. The resistance of each stack was measured, then each stack was subjected to anneal conditions typically used to process substrates in the context of back-end-of-line fabrication steps. The resistance of each stack was then re-measured. The y-axis in FIG. 5 shows the change in resistance after anneal. If the resistance after anneal was lower or unchanged compared to the resistance before anneal, this indicates that the barrier layer successfully prevented copper diffusion into the silicon wafer. By contrast, if the resistance after anneal was greater than the resistance before anneal, this indicates that the copper diffused through the barrier layer and reacted with the silicon substrate to form copper silicide, meaning that the barrier layer was not effective in preventing diffusion.

Various types of barrier layers were examined in the experiment shown in FIG. 5. Notably, zinc oxide and tin oxide are effective as diffusion barriers, even at very thin thicknesses. For instance, at these conditions, zinc oxide is an effective copper diffusion barrier at thicknesses of at least about 10 Angstroms. Similarly, at these conditions, tin oxide is an effective copper diffusion barrier at thicknesses of at least about 8 Angstroms. These materials are effective as diffusion barriers at thicknesses that are less than those of traditional barrier layer materials such as tantalum. As mentioned above, the barrier layer may have a maximum thickness to ensure that it does not occupy too much space within the interconnect structure. Other metal oxides may be used as described below. With reference to FIG. 1, it is believed that the various metal oxides described herein are effective at preventing diffusion of the conductive metal 109 into the dielectric material 103 at the thicknesses described herein.

III. Reduction of Metal Oxide Barrier Layer to Form In-Situ Metal Liner

In certain embodiments, an upper surface of a metal oxide barrier layer may be reduced to form a thin metal layer to improve adhesion of a subsequently deposited layer such as a liner, seed layer, or conductive metal. This reduction may be achieved by exposing the substrate to a reducing gas and/or a reducing plasma. Exposure to the reducing gas/plasma creates a layer of metal at the top of the metal oxide barrier layer. The layer of metal acts as an in-situ adhesion layer, also referred to as an in-situ metal liner. In various embodiments, the metal layer that forms may have a thickness between about 0.1-2 nm.

FIG. 6 illustrates a flow chart describing a method of reducing an upper portion of a metal oxide barrier layer to form an in-situ metal adhesion layer. The method begins at operation 601, where a substrate is received in a reaction chamber. The substrate may include dielectric material with recessed features formed therein, and an exposed metal oxide barrier layer lining the dielectric material. The method of FIG. 6 may take place after the method of FIG. 3 and/or after the method of FIG. 4. At operation 603, the substrate is exposed to a reducing gas or reducing plasma to thereby reduce the upper surface of the metal oxide barrier layer to metal. As compared to the metal oxide, the metal provides improved adhesion to a subsequently deposited layer.

In one example, the conducting metal of the interconnect structure (e.g., conducting metal 109 in FIG. 1) is copper, which has poor adhesion to many metal oxides, but good adhesion to many metals. It is expected that the metal layer will have good adhesion to its own underlying metal oxide, as well as to the copper (or other conductive metal/other subsequently deposited layer). With reference to FIG. 1, in some examples, the upper surface of barrier layer 105 is reduced from metal oxide to metal, and the liner 107 is omitted, such that the conductive metal 109 (or seed layer, if used) forms directly on the metal on the upper surface of the barrier layer 105.

In many cases where the upper surface of the barrier layer is reduced from metal oxide to metal, there is no need to include a separate liner (e.g., liner 107 in FIG. 1). The metal layer essentially acts as an in-situ liner and adhesion layer. One advantage of this technique is that the in-situ metal liner/adhesion layer that forms at the upper surface of the metal oxide barrier layer can be thinner than conventionally formed liners.

Example species that may be used in the reducing gas or reducing plasma are discussed further below in the section related to Reactants and Other Processing Gases.

Example processing conditions for reducing the upper surface of the metal oxide through exposure to reducing gas or plasma may be as follows. The support on which the substrate is positioned may be maintained at a temperature between about 0-400° C. The pressure in the reaction chamber may be maintained between about $10^{-8}$ Torr to 760 Torr. The reducing gas may be provided at a rate between about 0.1-1000 sccm. The substrate may be exposed to the reducing gas or plasma for a duration between about 1-60 seconds. Where plasma is used, it may be generated at an RF power between about 0.2-3 KW. The plasma may be generated at one or more frequencies, for example at 13.56 kHz and/or 100 khz. The duty cycle of the plasma may be between about 100% to 1%. Any type of plasma may be used as desired for a particular application (e.g., inductively coupled plasma, capacitively coupled plasma, microwave plasma, remote plasma, direct plasma, etc).

In some embodiments herein, the metal oxide barrier layer is not subjected to any reduction operation. Instead, a subsequent layer (e.g., a liner, seed layer, or conductive metal) is deposited directly on a metal oxide barrier layer.

IV. Deposition of Optional Liner and Seed Layer

The embodiments herein are not limited to any particular method for deposition of the liner or seed layer. In some cases, the liner and/or seed layer is deposited through conventional means such as physical vapor deposition. In other cases, the liner and/or seed layer may be deposited through ALD or CVD, either of which may be driven by thermal energy or plasma energy. In some cases, the seed layer may be deposited as a seed layer precursor, which is then converted to a seed layer through an anneal or plasma treatment process, as discussed in the next section.

ALD and CVD have been avoided in the context of depositing seed layers. Typically, the seed layer is copper, and there are no ALD/CVD copper deposition processes in wide commercial use due to difficulties in producing smooth, conductive copper films with these methods. However, various processing techniques described herein may enable the use of ALD and CVD to deposit the liner and/or seed layer. The liner and/or seed layer may include copper and/or another metal as described further below.

FIG. 7 illustrates a flow chart describing a method of forming a barrier layer and a seed layer according to certain embodiments. The method begins at operation 701, where a substrate is received in a reaction chamber. The substrate includes dielectric material with recessed features formed therein. At operation 703, a metal oxide barrier layer is deposited through CVD or ALD, for example using the methods described in relation to FIGS. 3 and 4, respectively. Next, at operation 705, the substrate is optionally exposed to a reducing gas and/or a reducing plasma to thereby reduce an upper surface of the metal oxide barrier layer to form an in-situ metal liner. This reduction may occur as described in relation to FIG. 6. The reduction from metal oxide to metal may improve adhesion of a subsequently deposited metal seed layer. Alternatively or in addition, a liner may be deposited on the metal oxide barrier layer through CVD or ALD, for example using the methods of FIGS. 3 and 4, respectively. At operation 707, the metal seed layer is deposited on the substrate using CVD or ALD, for example using the methods described in relation to FIGS. 3 and 4, respectively. The metal seed layer may form on the metal oxide barrier layer or on the liner that is optionally formed on the top surface of the metal oxide barrier layer. Example reactants are discussed further below in the section related to Reactants and Other Processing Gases.

Example processing conditions for forming a liner or metal seed layer through thermal CVD may be as follows. The support on which the substrate is positioned may be controlled to a temperature between about 0-400° C. A pressure in the reaction chamber may be maintained between about $10^{-8}$ Torr to 760 Torr. The metal-containing reactant may flow at a rate between about 0.1-1000 sccm. The second reactant may flow at a rate between about 0.1-1000 sccm. The reaction may occur for a duration between about 10 seconds to 5 minutes. Example thicknesses for the liner may be between about 1-20 Angstroms, and example thicknesses for the metal seed layer or metal nitride seed layer precursor may be between about 5-30 Angstroms.

Example processing conditions for forming a liner or metal seed layer through plasma enhanced CVD may as follows. The support on which the substrate is positioned may be controlled to a temperature between about 0-400° C. A pressure in the reaction chamber may be maintained between about $10^{-8}$ Torr to 760 Torr. The metal-containing reactant may flow at a rate between about 0.1-1000 sccm. The second reactant may flow at a rate between about 0.1-1000 sccm. The reaction may occur for a duration between about 1 second-5 minutes. The plasma may be any kind of plasma. The plasma may be generated at an RF power between about 0.2 to 3 kW. The plasma may be generated at one or more frequencies, for example at 13.56 kHz and/or at 100 kHz. The plasma may have a duty cycle between about 100% to 1%. Example thicknesses are provided above.

Example processing conditions for forming a liner or metal seed layer through thermal ALD may as follows. The support on which the substrate is positioned may be controlled to a temperature between about 50-400° C. A pressure in the reaction chamber may be maintained between about $10^{-8}$ Torr to 760 Torr. The metal-containing reactant may flow at a rate between about 0.1-1000 sccm, for a duration between about 1-60 seconds. A purge gas may flow at a rate between about 0.1-1000 sccm, for a duration between about 1-60 seconds. The second reactant may flow at a rate between about 0.1-1000 sccm, for a duration between about 1-60 seconds. Example thicknesses are provided above.

Example processing conditions for forming a liner or metal seed layer through plasma enhanced ALD may as follows. The support on which the substrate is positioned may be controlled to a temperature between about 0-400° C. A pressure in the reaction chamber may be maintained between about $10^{-8}$ Torr to 760 Torr. The metal-containing reactant may flow at a rate between about 0.1-1000 sccm, for a duration between about 1-60 seconds. A purge gas may flow at a rate between about 100-1000 sccm, for a duration between about 1-60 seconds. The second reactant may flow at a rate between about 0.1-1000 sccm, for a duration between about 1-60 seconds. The substrate may be exposed to plasma for duration between about 1-60 seconds. The plasma may be any kind of plasma. The plasma may be generated at an RF power between about 0.2-3 kW. The plasma may be generated at one or more frequencies, for example at 13.56 kHz and/or at 100 kHz. The plasma may have a duty cycle between about 100% to 1%. Example thicknesses are provided above.

V. Deposition of Seed Layer Precursor and Conversion to Seed Layer

In some embodiments, the seed layer may be formed in steps. For example, in a first step, CVD or ALD may be used to form a seed layer precursor such as a metal nitride. The CVD or ALD may be thermal or plasma-based, as desired for a particular application. In a second step, an anneal or plasma treatment may be used to convert the metal nitride to metal by volatilizing or otherwise removing the nitrogen from the metal nitride seed layer precursor.

FIG. 8 illustrates a flow chart describing a method of forming a seed layer according to certain embodiments. The method begins at operation 801, where a substrate is received in a reaction chamber. The substrate includes dielectric material, a metal oxide barrier layer, and an optional liner (which may be a conventional liner or an in-situ metal liner formed by reducing the upper surface of the metal oxide barrier layer, as described in relation to FIG. 6). The method of FIG. 7 may begin after the method of FIG. 6, or after the method of FIG. 3, or after the method of FIG. 4, or after operation 703 or 705 of FIG. 7. At operation 803, a metal nitride seed layer precursor is deposited on the substrate. The metal nitride seed layer precursor may form on the metal oxide barrier layer or on the optional liner. The metal nitride seed layer precursor may be deposited through ALD or CVD, either of which may be driven by thermal energy or plasma energy. Where CVD is used, the method of FIG. 3 may be used to deposit the seed layer precursor. Where ALD is used, the method of FIG. 4 may be used to deposit the seed layer precursor. Next, at operation 805, the substrate is exposed to an anneal process or to a plasma treatment process to thereby volatilize or otherwise remove the nitrogen in the metal nitride seed layer precursor, thereby converting the metal nitride seed layer precursor to a metal seed layer.

Where ALD or CVD are used to deposit a metal nitride seed layer precursor, the first reactant may be a metal-containing reactant and the second reactant may be a nitrogen-containing reactant. Example reactants are discussed below in the section related to Reactants and Other Processing Gases.

Example processing conditions for forming a metal nitride seed layer precursor may be the same as those provided above for forming the metal seed layer.

Example processing conditions for an anneal process to convert the metal nitride seed layer precursor to the metal seed layer may be as follows. The support on which the substrate is positioned may be controlled to a temperature between about 100-400° C. A pressure in the reaction chamber may be maintained between about $10^{-8}$ Torr to 760 Torr. A processing gas such as $H_2$ or forming gas (e.g., $H_2$ and $N_2$ at a sub-explosive ratio) may flow at a rate between about 100-5000 sccm. The substrate may be exposed to the anneal process for a duration between about 30 seconds to 10 minutes.

Example processing conditions for a plasma treatment process to convert the metal nitride seed layer precursor to the metal seed layer may be as follows. The support on which the substrate is positioned may be maintained at a temperature between about –50° C. and 400° C. In some embodiments where a plasma treatment is used to convert the metal nitride seed layer precursor to the metal seed layer, the substrate may be actively cooled during this step. The active cooling may help control dewetting and agglomeration of the metal, which produces a higher quality, continuous metallic seed layer. The pressure in the reaction chamber may be maintained between about $10^{-8}$ Torr to 760 Torr. The gas that forms the plasma may include $H_2$, $NH_3$, $N_2$, Ar, or combinations thereof. This gas may be provided at a rate between about 0.1 to 1000 sccm. The substrate may be exposed to the plasma for a duration between about 1 second to 5 minutes. The plasma may be generated at an RF power between about 0.2-3 kW. The plasma may be generated at one or more frequencies, for example at 13.56 kHz and/or 100 kHz. The duty cycle of the plasma may be between about 100%-1%. Any type of plasma may be used as desired for a particular application (e.g., inductively coupled plasma, capacitively coupled plasma, microwave plasma, remote plasma, direct plasma, etc.).

The anneal process or plasma treatment process may convert the entire metal nitride seed layer precursor to the metal seed layer, or it may convert only a portion (e.g., an upper portion) of the metal nitride seed layer precursor. In various embodiments, the anneal process or plasma treatment process converts at least the upper 0.2 nm of the metal nitride seed layer precursor to metal.

VI. Deposition of Conductive Metal

With reference to FIG. 1, the conductive metal 109 is typically deposited through electroplating. Electroplating is particularly advantageous due to its low cost and high quality filling results. In some embodiments, the conductive metal 109 may be deposited through alternative techniques such as PVD, ALD, and/or CVD. Where ALD or CVD are used, the processing conditions may be the same as those described in relation to forming the metal seed layer. Where electroplating or PVD are used, the processing conditions may be conventional processing conditions selected by a person of ordinary skill in the art.

VII. Materials of the Interconnect Structure

As mentioned above, commercially available interconnect structures are relatively limited in terms of what materials can be used, as well as the processes used to form the materials. However, the techniques described herein enable the use of additional materials that have not conventionally been used in this context.

With reference to FIG. 1, in various embodiments herein, the dielectric material 103 may be a silicon-containing material such as silicon, silicon oxide, or silicon nitride. The dielectric material 103 is often a low-k material, as defined above. The dielectric material 103 may be doped with one or more dopants such as carbon, nitrogen, etc.

In various embodiments herein, the barrier layer 105 is a metal oxide. Various different metals may be used. For instance, the metal in the metal oxide may be magnesium or a group 3-14 metal. In certain implementations, the metal oxide may include a metal selected from the group consisting of: aluminum, copper, indium, magnesium, manganese, tin, zinc, ruthenium, tungsten, titanium and combinations thereof.

A number of materials may be used for the optional liner 107. In cases where the metal oxide barrier layer 105 is subjected to a reducing gas or reducing plasma such that liner 107 is an in-situ metal liner, the liner 107 includes the same metal as the metal oxide barrier layer from which it forms. In other cases, the liner 107 may be omitted. In other cases, the liner 107 may be a conventional material deposited through conventional means. In various embodiments herein, the liner 107 may be or include a metal. Nitrides, carbides, and/or carbonitrides may be used in some cases. Various different metals may be used. For instance, the metal in the liner may be magnesium or a group 3-14 metal. In certain implementations, the metal in the liner 107 may be selected from the group consisting of: aluminum, copper, indium, magnesium, manganese, tin, zinc, ruthenium, cobalt, tungsten and combinations thereof. The liner may have inclusions of another element, for example carbon and/or nitrogen.

Likewise, a number of different materials may be used for the seed layer (not shown in FIG. 1). The seed layer may be positioned between the barrier layer 105 and the conductive metal 109, or between the liner 107 and the conducting metal 109. In many cases, the seed layer is metal. The metal may be selected from the group consisting of: copper, cobalt, iridium, molybdenum, palladium, ruthenium, tungsten, and combinations thereof. Similarly, in cases where the seed layer is formed by converting a metal nitride seed layer precursor to the metal seed layer, the metal in the metal nitride seed layer precursor may be selected from this same group of metals.

Various different materials may be used for conductive metal 109. While in most commercial interconnect structures conductive metal 109 is copper, the embodiments herein are not so limited. In certain embodiments, the conductive metal 109 includes a metal selected from the group consisting of: copper, cobalt, iridium, molybdenum, palladium, ruthenium, tungsten, and combinations thereof. In certain embodiments, the metal in the seed layer is the same as the metal of the conductive metal 109. In other embodiments, these are different metals.

The materials described herein may or may not be stoichiometrically balanced.

VIII. Reactants and Other Processing Gases

The various materials described herein may be formed and/or treated using any reactants appropriate for the application. In some cases, particular reactants may be used.

A. Reactants/Processing Gases for Plasma Pre-Treatment to Promote Nucleation and Adhesion on Dielectric Material As discussed in relation to FIG. 2, in various embodiments herein, a substrate having dielectric material exposed on its surface is exposed to plasma to deliberately damage a top surface of the dielectric material. The plasma exposure may remove a dopant such as carbon from the top surface of the dielectric material, thereby improving adhesion to a subsequently deposited layer such as a metal oxide barrier layer.

In some cases, the plasma used to pre-treat the substrate to damage the dielectric material is generated from inert species such as helium, neon, argon, krypton, or a combination thereof. In other cases, the plasma is generated from chemically reactive species such as $H_2$, Oz, $NH_3$, $CO_2$, $N_2O$. $N_2$, or a combination thereof. In still other cases, the plasma may be generated from a combination of inert and chemically reactive species such as any of those listed above.

B. Reactants/Processing Gases for Atomic Layer Deposition and Chemical Vapor Deposition As discussed in relation to FIGS. 3, 4, 7, and 8, the metal oxide barrier layer, metal seed layer, and/or metal nitride seed layer precursor may be deposited through ALD and/or CVD. These films can be deposited using a suitable metal-containing reactant and a co-reactant. In various embodiments, suitable metal-containing reactants may incorporate one or more monodentate ligands such as halides, amides, imides, nitrides, oxides, alkyls, allyls, alkoxides, thiolates, carbenes, phosphines, carbon monoxide, nitriles, isonitriles, alkenes, alkynes, bidentate ligands such as diketonates, ketoiminates, diketiminates, ketoesterates, aminoalkoxides, amidinates, diazadienes, amidates, allyls, di-alkenes, and multidentate ligands such as cyclopentadienyls, tri-alkenes, and other multidentate organic ligands. The metal-containing reactants also include at least one metal, for example the metal that is desired in the deposited material. Suitable metals include those from Groups 3-14 of the periodic table, plus magnesium.

In some cases, a metal-containing reactant used to deposit a metal oxide barrier layer may be an aluminum-containing reactant, a copper-containing reactant, an indium-containing reactant, a magnesium-containing reactant, a manganese-containing reactant, a tin-containing reactant, a zinc-containing reactant, or a combination thereof. In some embodiments, a metal-containing reactant used to deposit a metal seed layer or metal nitride seed layer precursor may be a copper-containing reactant, a cobalt-containing reactant, an iridium-containing reactant, a molybdenum-containing reactant, a palladium-containing reactant, a ruthenium-containing reactant, a tungsten-containing reactant, or a combination thereof. Other metals and metal-containing reactants may be used in some cases.

Example aluminum-containing reactants include, but are not limited to, trimethylaluminum. Example cobalt-containing reactants include, but are not limited to, octacarbonyldicobalt, (2-tert-butylallyl)tricabonylcobalt, (3,3-dimethyl-1-butyne)hexacarbonyldicobalt, cyclopentadienyldicarbonylcobalt, bis(1,4-diisopropyl-diazadiene)cobalt, bis(1,4-di-tert-butyl-diazadiene)cobalt, bis(N,N'-diisopropylacetamidinato)cobalt, and bis(N-tert-butyl-N'-ethylpropanimidamidinato)cobalt.

Example copper-containing reactants include, but are not limited to, bis(dimethylamino-2-propoxy)copper, bis(N,N'-di-sec-butylacetamidinate)dicopper, bis(dimethylaminoethoxy)copper, bis(diethylamino-2-propoxy)copper, bis(ethylmethylamino-2-propoxy)copper, and bis(dimethylamino-2-methyl-2-butoxy)copper.

Example indium-containing reactants include, but are not limited to, trimethylindium. Example iridium-containing reactants include, but are not limited to, tris(acetylacetonate) iridium. Example magnesium-containing reactants include, but are not limited to, bis(1,4-di-tert-butyl-diazadiene)magnesium, and bis(ethylcyclopentadienyl)magnesium.

Example manganese-containing reactants include, but are not limited to, bis(cyclopentadienyl)manganese, bis(ethylcyclopentadienyl)manganese, bis(tetramethylcyclopentadienyl)manganese(II), bis(pentamethylcyclopentadienyl)manganese(II), bis(1,4-di-tert-butyl-diazadiene)manganese, bis(bis(trimethylsilylamido))manganese, bis(bis(ethyldimethylsilylamido))manganese, and bis(N,N'-diisopropylpentylamidinato)manganese.

Example molybdenum-containing reactants include, but are not limited to, hexafluoromolybdenum ($MoF_6$), pentachloromolybdenum ($MoCl_5$), molybdenum dichloride dioxide ($MoO_2Cl_2$), molybdenum tetrachloride oxide ($MoOCl_4$), and molybdenum hexacarbonyl ($Mo(CO)_6$). In some cases, other molybdenum-containing oxyhalides of the formula $Mo_xO_xH_z$ may be used, where H is a halogen (fluorine (F), chlorine (Cl), bromine (Br), or iodine (I)) and x, y, and z being any number greater than zero that can form a stable molecule. These include molybdenum tetrafluoride oxide ($MoOF_4$), molybdenum dibromide dioxide ($MoO_2Br_2$), and molybdenum oxyiodides $MoO_2I$ and $Mo_4O_{11}I$. Organo-metallic molybdenum-containing precursors may also be used with examples including molybdenum-containing precursors having cyclopentadienyl ligands. Further examples include precursors of the formula $Mo_2L_n$, wherein each L is independently selected from an amidate ligand, an amidinate ligand, and a guanidinate ligand, where n is 2-5. The $Mo_2L_n$ precursor includes a multiple molybdenum-molybdenum bond (such as a double bond or any multiple bond with a bond order of 2-5). Further examples include halide-containing heteroleptic molybdenum compounds (i.e., compounds having different types of ligands). Particular examples of such precursors are compounds that include molybdenum, at least one halide forming a bond with molybdenum, and at least one organic ligand having any of the N, O, and S elements, where an atom of any of these elements forms a bond with molybdenum. Examples of suitable organic ligands that provide nitrogen or oxygen bonding include amidinates, amidates, iminopyrrolidinates, diazadienes, beta-imino amides, alpha-imino alkoxides, beta-amino alkoxides, beta-diketiminates, beta-ketoiminates, beta-diketonates, amines, and pyrazolates. Examples of suitable organic ligands that provide sulfur bonding include thioethers, thiolates, dithiolenes, dithiolates, and α-imino thiolenes. These ligands may be substituted or unsubstituted. In some embodiments, these ligands include one or more substituents independently selected from the group consisting of H, alkyl, fluoroalkyl, alkylsilyl, alkylamino, and alkoxy substituents. The organic ligands can be neutral or anionic (e.g., monoanionic or dianionic), and molybdenum can be in a variety of oxidation states, such as +1, +2, +3, +4, +5, and +6.

Example palladium-containing reactants include, but are not limited to, 1-methylallyl(hexafluoroacetylacetonato)-palladium(II) and bis(hexafluoroacetylacetonato)palladium. Example platinum-containing reactants include, but are not limited to, methylcyclopentadienyltrimethylplatinum.

Example rhenium-containing reactants include, but are not limited to, pentachlororhenium. Example ruthenium-containing reactants include, but are not limited to, dodecacarbonyltriruthenium, (2,4-dimethylpentadienyl)ethylcyclopentadienylruthenium, (1-ethyl-1,4-cyclohexadienyl) ethylbenzeneruthenium, bis(ethylcyclopentadienyl) ruthenium, and tetraoxoruthenium. Example tantalum-containing reactants include, but are not limited to, tert-butylimido-tris (dimethylamido) tantalum.

Example tin-containing reactants include, but are not limited to, tetrakis(dimethylamino) tin, tin(II) fluoride, tin (IV) chloride, tin(IV) chloride, tin(IV) bromide, stannane, trimethyltin chloride, dimethyltin dichloride, methyltin trichloride, tetraethyltin, tetramethyltin, dibutyltin diacetate, (dimethylamino)trimethyltin(IV), bis[bis(trimethylsilyl) amino]tin(II), dibutyldiphenyltin, hexaphenylditin(IV), tetraallyltin, tetrakis(diethylamino)tin(IV), tetravineyltin, tin (II)acetylacetonate, tricyclohexyltin hydride, trimethyl (phenylethynyl)tin, trimethyl(phenyl)tin, tetrakis (ethylmethylamino)tin, tin(II) (1,3-bis(1,1-dimethylethyl)-4, 5-dimethyl-(4R,5R)-1,3,2-diazastannolidin-2-ylidene, and $N^2,N^3$-di-tert-butyl-butane-2,4-diamino-tin(II).

Example titanium-containing reactants include, but are not limited to, tetrakis(dimethylamido)titanium. Example tungsten-containing reactants include, but are not limited to, hexafluorotungsten, hexachlorotungsten, pentachlorotungsten, and bis(tert-butylimido)bis(dimethylamido)tungsten. Example yttrium-containing reactants include, but are not limited to, tris(isopropylcyclopentadienyl) yttrium. Example zinc-containing reactants include, but are not limited to, dimethylzinc, diethylzinc, diallylzinc, and bis(2-methylallyl)zinc. Other metal-containing reactants known to those of ordinary skill in the art may be used in some embodiments.

For the deposition of metal oxide films such as a metal oxide barrier layer, the metal-containing reactant is paired with an oxygen-containing reactant. Example oxygen-containing reactants include, but are not limited to, water ($H_2O$), oxygen ($O_2$), hydrogen peroxide ($H_2O_2$), ozone ($O_3$), carbon dioxide ($CO_2$), and nitrous oxide ($N_2O$). For the deposition of metal films such as metal seed layers or metal nitride films such as metal nitride seed layer precursors, the metal-containing reactant is paired with a nitrogen- and/or hydrogen-containing reactant. Example nitrogen- and/or hydrogen-containing reactants include, but are not limited to, dinitrogen ($N_2$), dihydrogen ($H_2$), hydrazine ($N_2H_4$), alkylhydrazines, and alkylamines.

In some embodiments, one or more non-reactive gases may be provided during the deposition, for example as a purge gas or as part of a plasma generation gas. Examples of non-reactive gases may include helium, neon, argon, krypton, etc. In some cases, nitrogen may be used.

C. Reactants/Processing Gases for Reduction of Metal Oxide Barrier Layer to Form In-Situ Metal Liner As discussed in relation to FIGS. 6 and 7, in some embodiments a substrate having an exposed metal oxide barrier layer is exposed to a reducing gas or a reducing plasma to thereby reduce a top surface of the metal oxide barrier layer to form an in-situ metal liner.

Example reducing gases that may be used include, but are not limited to, hydrogen ($H_2$), ammonia ($NH_3$), hydrazine ($N_2H_4$), alkylhydrazines such as N,N'-dimethylhydrazine and tert-butylhydrazine, and other species that include both nitrogen and hydrogen, and combinations thereof. Where a plasma is used, the plasma may be generated from any one or more of the example reducing gases. Inert gases may be provided in the plasma or processing gas, as well.

D. Reactants/Processing Gases for Conversion of Metal Nitride Seed Layer Precursor to Metal Seed Layer As discussed in relation to FIG. 8, in some embodiments a metal nitride seed layer precursor may be converted to a metal seed layer, for example by exposing a substrate to an anneal process or a plasma treatment process.

During the anneal process, the substrate may be exposed to a reducing process gas such as $H_2$ or $NH_3$. Along with the reducing gas an inert carrier gas such as $N_2$ or Ar may be flowed.

Alternatively or in addition, during a plasma treatment process, the substrate may be exposed to plasma that is generated from a reducing gas such as $H_2$ or $NH_3$. The plasma may be generated with the aid of an inert carrier such as He or Ar.

IX. Additional Embodiments

The sections above describe various processing steps that may take place in certain embodiments. These processing steps may be combined or omitted as desired for a particular application. This section provides examples of how the processing steps may be combined in certain implementations. These embodiments are examples and are not intended to be limiting.

In one embodiment, a substrate having a single or dual damascene structure (e.g., recessed features formed in dielectric material) is exposed to a plasma pre-treatment to deliberately damage a top surface of the dielectric material, as described in relation to FIG. 2. During the plasma pre-treatment, the substrate is exposed to a hydrogen ($H_2$) plasma that is generated directly in the same reaction chamber in which the substrate is positioned. The plasma is generated at an RF power of about 1.5-3 KW (e.g., about 1.8 KW), for a duration between about 0-60 seconds (e.g., about 15 seconds). Next, a zinc oxide barrier layer is deposited on the damaged top surface of the dielectric material. The zinc oxide barrier layer is deposited through CVD using a zinc-containing reactant (e.g., diethyl zinc) and an oxygen-containing reactant (e.g., $O_2$), for example using the CVD method described in relation to FIG. 3. During the CVD reaction to form the zinc oxide barrier layer, the substrate may be exposed to the reactant gases for a duration between about 10-300 seconds (e.g., about 30 seconds), at a pressure between about 20-500 Torr (e.g., about 100 Torr), while a support on which the substrate is positioned is maintained at a temperature between about 50-400° C. (e.g., about 200° C.). A copper seed layer is then deposited on the zinc oxide barrier layer, for example using PVD. After the seed layer is deposited, copper is electroplated into the recessed features of the damascene structures using a conventional copper electroplating process.

In another embodiment, a substrate having a single or dual damascene structure is exposed to a plasma pre-treatment to deliberately damage a top surface of the dielectric material, as described in relation to FIG. 2. During the plasma pre-treatment, the substrate is exposed to a hydrogen ($H_2$) plasma that is generated directly in the same reaction chamber in which the substrate is positioned. The plasma is generated at an RF power of about 1.5-3 KW (e.g., about 1.8 kW), for a duration between about 0-60 seconds (e.g., about 15 seconds). Next, a zinc oxide barrier layer is deposited on the damaged top surface of the dielectric material. The zinc oxide barrier layer is deposited through CVD using a zinc-containing reactant (e.g., diethyl zinc) and an oxygen-containing reactant (e.g., $O_2$), for example using the CVD method described in relation to FIG. 3. During the CVD reaction to form the zinc oxide barrier layer, the substrate may be exposed to the reactant gases for a duration between about 10-300 seconds (e.g., about 30 seconds), at a pressure between about 20-500 Torr (e.g., about 100 Torr), while a support on which the substrate is positioned is maintained at a temperature between about 50-400° C. (e.g., about 200°

C.). Next, a copper seed layer is deposited through ALD using a copper-containing reactant (e.g., copper-amino-alkoxide) and a co-reactant (e.g., diethyl zinc), for example using the ALD method described in FIG. 4. After the copper seed layer is deposited, copper is electroplated into the recessed features of the damascene structures using a conventional copper electroplating process.

In another embodiment, a substrate having a single or dual damascene structure is exposed to a plasma pre-treatment to deliberately damage a top surface of the dielectric material, as described in relation to FIG. 2. During the plasma pre-treatment, the substrate is exposed to an oxygen ($O_2$) plasma that is generated directly in the same reaction chamber in which the substrate is positioned. The plasma is generated at an RF power of about 1.5-3 KW (e.g., about 1.8 kW), for a duration between about 0-60 seconds (e.g., about 5 seconds). Next, a tin oxide barrier layer is deposited on the damaged top surface of the dielectric material. The tin oxide barrier layer is deposited through plasma enhanced ALD using a tin-containing reactant (e.g., tetrakis(dimethyl-amino) tin or another tin-containing reactant described herein) and an oxygen-containing reactant (e.g., $O_2$), for example using the ALD method described in relation to FIG. 4. During the ALD reaction to form the tin oxide barrier layer, the substrate may be exposed to the reactant gases while a support on which the substrate is positioned is maintained at a temperature between about 50-400° C. (e.g., about 200° C.). Next, a copper seed layer is deposited on the tin oxide barrier layer. After the copper seed layer is deposited, copper is electroplated into the recessed features of the damascene structures using a conventional copper electroplating process.

Any of the above examples (in this section or throughout the application) may be modified to include one or more additional processes described herein. For instance, the examples may be modified to include a step where the metal oxide barrier layer is exposed to a reducing gas or reducing plasma to thereby reduce an upper surface of the metal oxide barrier layer to form an in-situ metal liner. Alternatively or in addition, the examples may be modified to include a step where a seed layer precursor (e.g., a metal nitride seed layer precursor) is deposited and then exposed to an anneal process or to a plasma treatment process to convert the seed layer precursor to a metal seed layer. Alternatively or in addition, the examples may be modified such that the metal oxide barrier layer is deposited using two or more techniques in sequence, for example thermal ALD or thermal CVD followed by plasma enhanced ALD or plasma enhanced CVD. Many modifications are possible, and all such variations are considered to be within the scope of the disclosed embodiments.

X. Apparatus

Generally, the various processes described herein may be performed by any appropriate apparatus or combination of apparatuses. An appropriate apparatus includes hardware for achieving the process steps, as well as a controller configured to cause the process steps. Various different kinds of processes are described herein, including, e.g., deposition processes, plasma treatment processes, gas- or plasma-based reducing processes, anneal processes, etc. In some embodiments, each of these steps may take place in an apparatus configured to perform that step. For instance, an ALD or CVD deposition step may take place in an apparatus configured to perform ALD and/or CVD, while an electrode-position step may take place in an apparatus configured to perform electroplating.

In some cases, multiple processing steps may take place on a single tool or system. These processing steps may include all of the processing steps described herein, or any subset thereof. The tool or system may include multiple different processing chambers, each of which may be configured to perform one or more particular steps. The processing chambers may be combined in a way that facilitates substrate transfer between the relevant processing chambers and processing steps.

Load locks may be provided to ensure that the substrate is not exposed to atmosphere as it is transferred from one processing chamber to another. Such load locks may be particularly useful for transfer steps where the substrate includes an oxidation-sensitive material (e.g., metal or metal nitride) exposed on its surface. In one example, a substrate may be transferred to a load lock from a processing chamber used to deposit or treat a seed layer (e.g., as described in relation to FIG. 7 or 8), and then transferred from the load lock into a processing chamber used to electroplate the conductive metal onto the seed layer. In operations where the substrate being transferred includes an exposed metal oxide layer, such load locks may be omitted, for example because exposure of a metal oxide layer to atmosphere is not expected to damage/change the metal oxide layer. The use of metal oxide barrier layers may simplify the processing requirements (e.g., substrate transfer requirements) compared to conventional barrier layer materials since there is no need to protect the substrate from exposure to atmosphere after the metal oxide barrier layer is deposited and before the next layer is processed.

In some cases, the processes described herein (or a subset thereof) may be performed by two or more apparatuses. For example, a first apparatus may be configured to perform at least one of the following: (a) pre-treat the substrate with plasma to deliberately damage the dielectric material as described in FIG. 2, and/or (b) deposit a metal oxide barrier layer on the dielectric material as described in relation to FIGS. 3 and 4. A second apparatus may be configured to perform the following: (a) deposit a metal seed layer as described in FIG. 7, and (b) electroplate the conductive metal onto the seed layer. In another example, the second apparatus may be configured to perform the following: (a) convert a metal nitride seed layer precursor to a metal seed layer, as described in FIG. 8, and (b) electroplate the conductive metal onto the seed layer. In some such examples, the second apparatus may be configured to deposit the metal nitride seed layer precursor prior to (a). Alternatively, the first apparatus may be configured to deposit the metal nitride seed layer precursor. The second apparatus may be further configured to expose the substrate to reducing gas or plasma to reduce the upper surface of the metal oxide barrier layer to metal prior to deposition of the metal seed layer or metal nitride seed layer precursor. It may be particularly advantageous to perform this step in the second apparatus such that when the substrate is transferred from the first apparatus to the second apparatus, the exposed surface of the substrate is the metal oxide barrier layer, which is resilient to atmospheric oxygen exposure.

Figure 9:
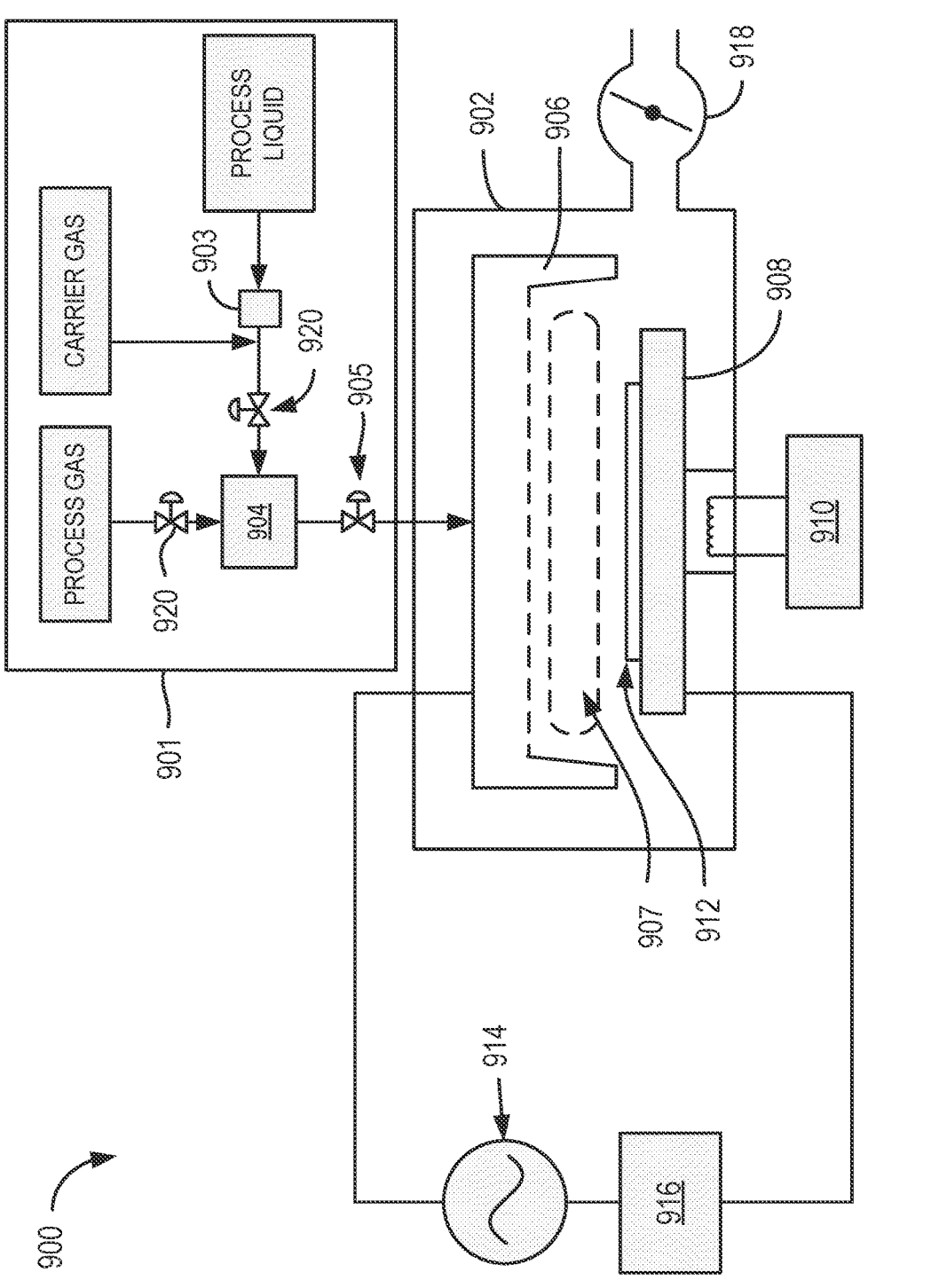
FIG. 9 illustrates a processing station configured to perform atomic layer deposition and/or chemical vapor deposition.

FIGS. 9-14 show various example processing tools that may be used to perform the steps described herein. FIG. 9 schematically shows an embodiment of a process station 900 that may be used to deposit material using atomic layer deposition (ALD) and/or chemical vapor deposition (CVD), either of which may be plasma enhanced. For example, the process station 900 may be used to deposit a metal oxide barrier layer as described in relation to FIGS. 3 and 4. Similarly, the process station 900 may be used to deposit a metal seed layer as described in relation to FIG. 7, or a metal nitride seed layer precursor as described in relation to FIG. 8. In some cases, process station 900 may also be used to perform one or more additional steps such as exposing the substrate to plasma to deliberately damage the top surface of the dielectric material as described in relation to FIG. 2, and/or exposing the substrate to reducing gas or plasma to reduce the top surface of the metal oxide barrier layer to an in-situ metal liner as described in relation to FIGS. 6 and 7, and/or exposing the substrate to an anneal or plasma to convert a metal nitride seed layer precursor to a metal seed layer as described in relation to FIG. 8.

For simplicity, the process station 900 is depicted as a standalone process station having a process chamber body 902 for maintaining a low-pressure environment. However, it will be appreciated that a plurality of process stations 900 may be included in a common process tool environment. Further, it will be appreciated that, in some embodiments, one or more hardware parameters of process station 900, including those discussed in detail below, may be adjusted programmatically by one or more computer controllers.

Process station 900 fluidly communicates with reactant delivery system 901 for delivering process gases to a distribution showerhead 906. Reactant delivery system 901 includes a mixing vessel 904 for blending and/or conditioning process gases for delivery to showerhead 906. One or more mixing vessel inlet valves 920 may control introduction of process gases to mixing vessel 904. Similarly, a showerhead inlet valve 905 may control introduction of process gasses to the showerhead 906.

Some reactants, like diethyl zinc, may be stored in liquid form prior to vaporization at and subsequent delivery to the process station. For example, the embodiment of FIG. 9 includes a vaporization point 903 for vaporizing liquid reactant to be supplied to mixing vessel 904. In some embodiments, vaporization point 903 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 903 may be heat traced. In some examples, mixing vessel 904 may also be heat traced. In one non-limiting example, piping downstream of vaporization point 903 has an increasing temperature profile extending from approximately 100° C. to approximately 150° C. at mixing vessel 904.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 903. In one scenario, a liquid injector may be mounted directly to mixing vessel 904. In another scenario, a liquid injector may be mounted directly to showerhead 906.

In some embodiments, a liquid flow controller upstream of vaporization point 903 may be provided for controlling a mass flow of liquid for vaporization and delivery to process station 900. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 906 distributes process gases toward substrate 912. In the embodiment shown in FIG. 9, substrate 912 is located beneath showerhead 906, and is shown resting on a pedestal 908. It will be appreciated that showerhead 906 may have any suitable shape, and may have any suitable number and arrangement of ports for distributing processes gases to substrate 912.

In some embodiments, a microvolume 907 is located beneath showerhead 906. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 908 may be raised or lowered to expose substrate 912 to microvolume 907 and/or to vary a volume of microvolume 907. For example, in a substrate transfer phase, pedestal 908 may be lowered to allow substrate 912 to be loaded onto pedestal 908. During a deposition process phase, pedestal 908 may be raised to position substrate 912 within microvolume 907. In some embodiments, microvolume 907 may completely enclose substrate 912 as well as a portion of pedestal 908 to create a region of high flow impedance during a deposition process.

Optionally, pedestal 908 may be lowered and/or raised during portions the deposition process to modulate process pressure, reactant concentration, etc., within microvolume 907. In one scenario where process chamber body 902 remains at a base pressure during the deposition process, lowering pedestal 908 may allow microvolume 907 to be evacuated. Example ratios of microvolume to process chamber volume include, but are not limited to, volume ratios between 1:900 and 1:10. It will be appreciated that, in some embodiments, pedestal height may be adjusted programmatically by a suitable computer controller.

In another scenario, adjusting a height of pedestal 908 may allow a plasma density to be varied during plasma activation and/or treatment cycles included in the deposition process. At the conclusion of the deposition process phase, pedestal 908 may be lowered during another substrate transfer phase to allow removal of substrate 912 from pedestal 908.

While the example microvolume variations described herein refer to a height-adjustable pedestal, it will be appreciated that, in some embodiments, a position of showerhead 906 may be adjusted relative to pedestal 908 to vary a volume of microvolume 907. Further, it will be appreciated that a vertical position of pedestal 908 and/or showerhead 906 may be varied by any suitable mechanism within the scope of the present disclosure. In some embodiments, pedestal 908 may include a rotational axis for rotating an orientation of substrate 912. It will be appreciated that, in some embodiments, one or more of these example adjustments may be performed programmatically by one or more suitable computer controllers.

Returning to the embodiment shown in FIG. 9, showerhead 906 and pedestal 908 electrically communicate with RF power supply 914 and matching network 916 for powering a plasma. In some embodiments, the plasma energy may be controlled by controlling one or more of a process station pressure, a gas concentration, an RF source power, an RF source frequency, and a plasma power pulse timing. For example, RF power supply 914 and matching network 916 may be operated at any suitable power to form a plasma having a desired composition of radical species. Examples of suitable powers are included above. Likewise, RF power supply 914 may provide RF power of any suitable frequency. In some embodiments, RF power supply 914 may be configured to control high- and low-frequency RF power sources independently of one another. Example low-frequency RF frequencies may include, but are not limited to, frequencies between 50 kHz and 900 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 908 may be temperature controlled via heater 910. Further, in some embodiments, pressure control for deposition process station 900 may be provided by butterfly valve 918. As shown in the embodiment of FIG. 9, butterfly valve 918 throttles a vacuum provided by a downstream vacuum pump (not shown). However, in some embodiments, pressure control of process station 900 may also be adjusted by varying a flow rate of one or more gases introduced to process station 900.

Figure 10:
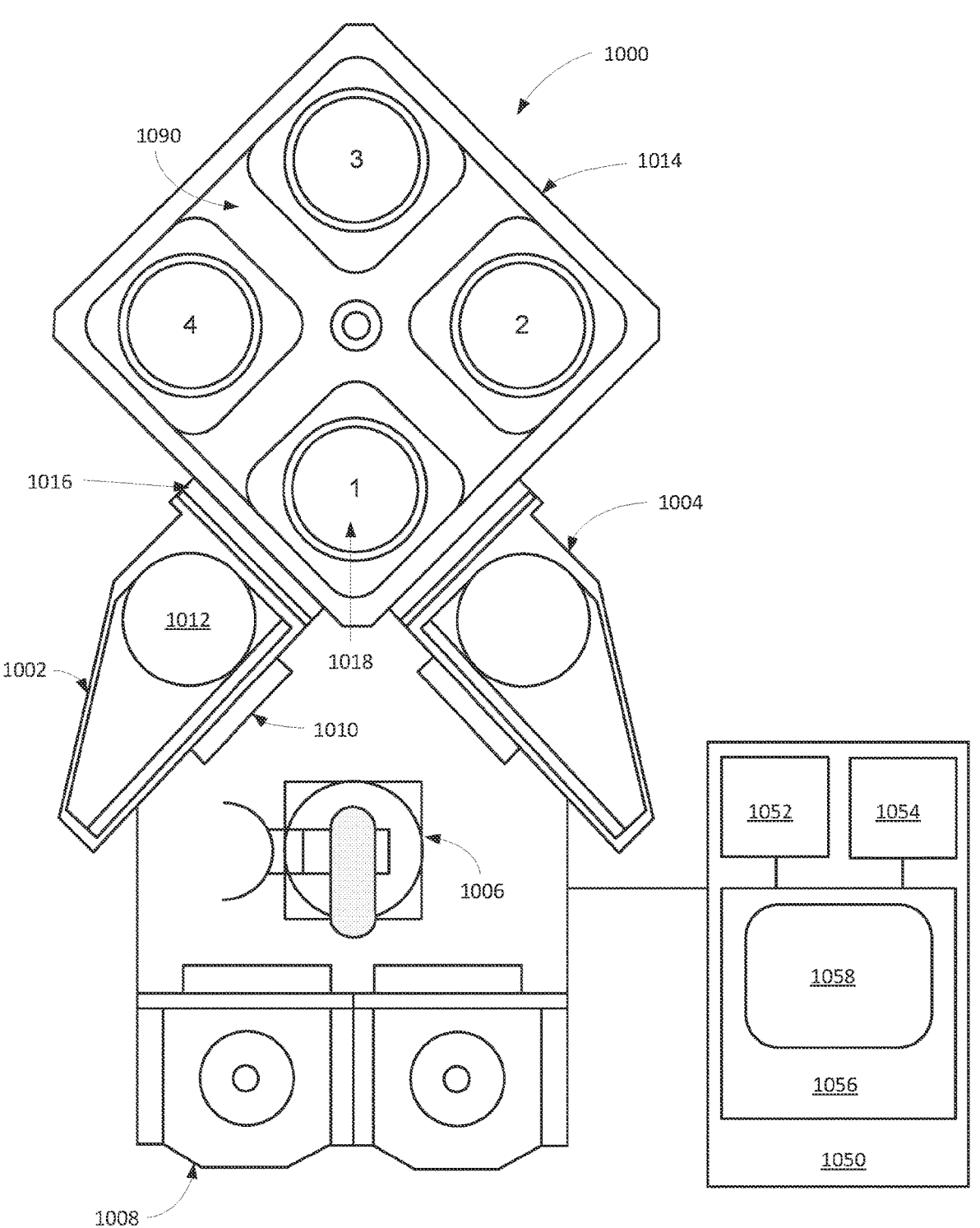
FIG. 10 depicts a multi-station processing apparatus configured to perform atomic layer deposition and/or chemical vapor deposition.

FIG. 10 shows a schematic view of an embodiment of a multi-station processing tool 1000 with an inbound load lock 1002 and an outbound load lock 1004, either or both of which may comprise a remote plasma source. Any of the steps that may take place in the processing station 900 of FIG. 9 may also take place in one or more of the stations in multi-station processing tool 1000. A robot 1006, at atmospheric pressure, is configured to move wafers from a cassette loaded through a pod 1008 into inbound load lock 1002 via an atmospheric port 1010. A wafer is placed by the robot 1006 on a pedestal 1012 in the inbound load lock 1002, the atmospheric port 1010 is closed, and the load lock is pumped down. Where the inbound load lock 1002 comprises a remote plasma source, the wafer may be exposed to a remote plasma treatment in the load lock prior to being introduced into a processing chamber 1014. Further, the wafer also may be heated in the inbound load lock 1002 as well, for example, to remove moisture and adsorbed gases. Next, a chamber transport port 1016 to processing chamber 1014 is opened, and another robot (not shown) places the wafer into the reactor on a pedestal of a first station shown in the reactor for processing. While the embodiment depicted in FIG. 10 includes load locks, it will be appreciated that, in some embodiments, direct entry of a wafer into a process station may be provided.

The depicted processing chamber 1014 comprises four process stations, numbered from 1 to 4 in the embodiment shown in FIG. 10. Each station has a heated pedestal (shown at 1018 for station 1), and gas line inlets. It will be appreciated that in some embodiments, each process station may have different or multiple purposes. While the depicted processing chamber 1014 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 10 also depicts an embodiment of a wafer handling system 1090 for transferring wafers within processing chamber 1014. In some embodiments, wafer handling system 1090 may transfer wafers between various process stations and/or between a process station and a load lock. It will be appreciated that any suitable wafer handling system may be employed. Non-limiting examples include wafer carousels and wafer handling robots. FIG. 10 also depicts an embodiment of a system controller 1050 employed to control process conditions and hardware states of process tool 1000. System controller 1050 may include one or more memory devices 1056, one or more mass storage devices 1054, and one or more processors 1052. Processor 1052 may include a CPU or computer, analog and/or digital input/output connections, stepper motor controller boards, etc.

In some embodiments, system controller 1050 controls all of the activities of process tool 1000. System controller 1050 executes system control software 1058 stored in mass storage device 1054, loaded into memory device 1056, and executed on processor 1052. System control software 1058 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 1000. System control software 1058 may be configured in any suitable way. For example, various process tool component subroutines or control objects may be written to control operation of the process tool components necessary to carry out various process tool processes in accordance with the disclosed methods. System control software 1058 may be coded in any suitable computer readable programming language.

In some embodiments, system control software 1058 may include input/output control (IOC) sequencing instructions for controlling the various parameters described above. For example, each phase of a PEALD process may include one or more instructions for execution by system controller 1050. The instructions for setting process conditions for a PEALD process phase may be included in a corresponding PEALD recipe phase. In some embodiments, the PEALD recipe phases may be sequentially arranged, so that all instructions for a PEALD process phase are executed concurrently with that process phase.

Other computer software and/or programs stored on mass storage device 1054 and/or memory device 1056 associated with system controller 1050 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1018 and to control the spacing between the substrate and other parts of process tool 1000.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 1050. The user interface may include a display screen, graphical software displays of the apparatus and/or process conditions, and user input devices such as pointing devices, keyboards, touch screens, microphones, etc.

In some embodiments, parameters adjusted by system controller 1050 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 1050 from various process tool sensors. The signals for controlling the process may be output on the analog and digital output connections of process tool 1000. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example ALD and CVD deposition apparatuses include, but are not limited to, apparatus from the ALTUS® product family, the VECTOR R product family, the STRIKERR product family, and/or the SPEED product family, each available from Lam Research Corp., of Fremont, California, or any of a variety of other commercially available processing systems. Two or more of the stations may perform the same functions. Similarly, two or more stations may perform different functions. Each station can be designed/configured to perform a particular function/method as desired.

Figure 11:
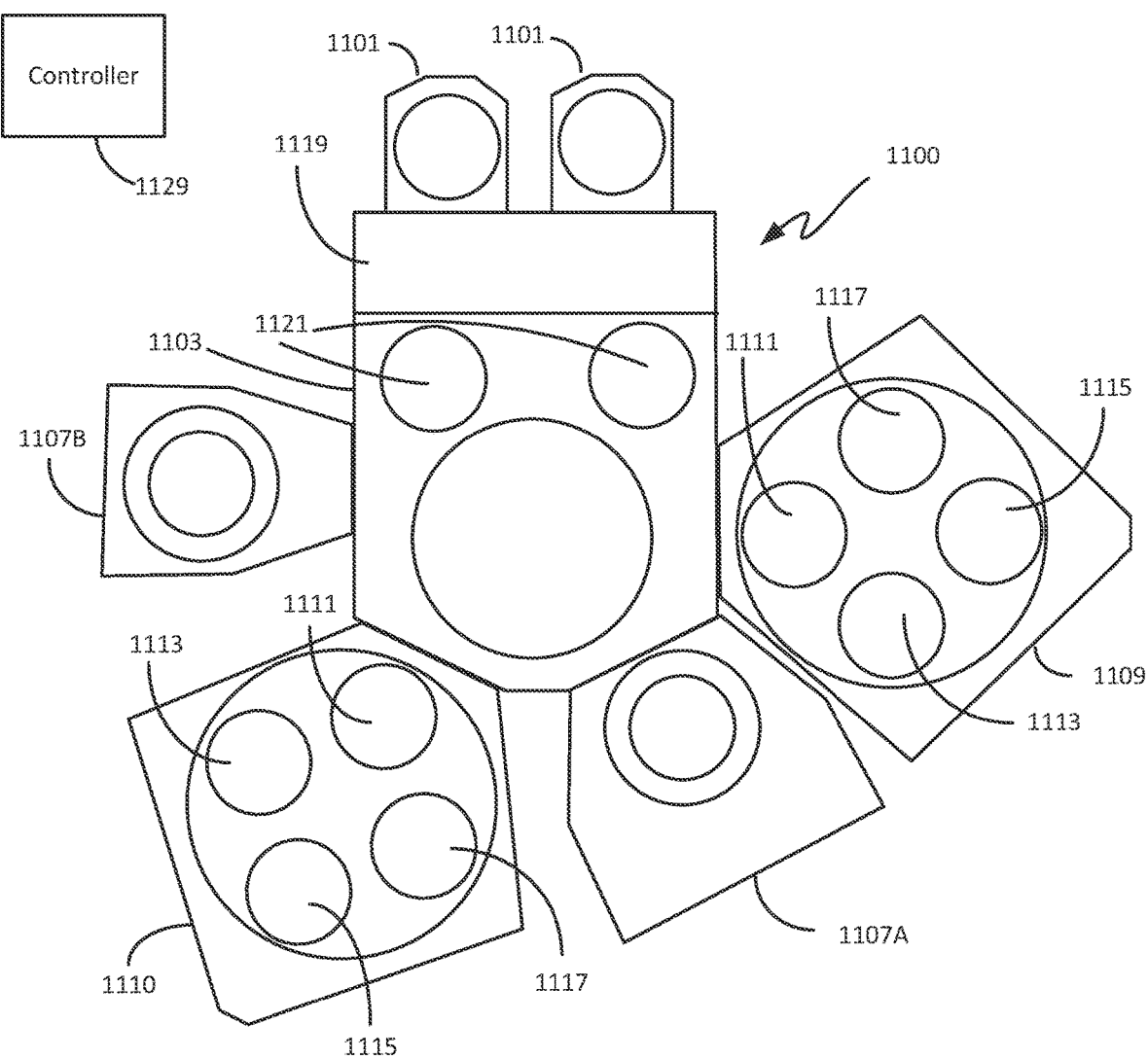
FIG. 11 shows a processing system configured to perform atomic layer deposition, chemical vapor deposition, and/or various other processing operations described herein.

FIG. 11 is a block diagram of a processing system suitable for conducting thin film deposition processes in accordance with certain embodiments. The system 1100 includes a transfer module 1103. The transfer module 1103 provides a clean, pressurized environment to minimize risk of contamination of substrates being processed as they are moved between various reactor modules. Mounted on the transfer module 1103 are two multi-station reactors 1109 and 1110, each capable of performing atomic layer deposition (ALD) and/or chemical vapor deposition (CVD) according to certain embodiments. Reactors 1109 and 1110 may include multiple stations 1111, 1113, 1115, and 1117 that may sequentially or non-sequentially perform operations in accordance with disclosed embodiments. The stations may include a heated pedestal or substrate support, one or more gas inlets or showerhead or dispersion plate.

Also mounted on the transfer module 1103 may be one or more single or multi-station modules 1107A and 1107B capable of performing plasma or chemical (non-plasma) pre-cleans, treatments, or any other processes described in relation to the disclosed methods. While only two modules 1107A and 1107B are shown, it is understood that additional modules may be provided as desired for a particular application. Each of the modules 1107A and 1107B may be independently configured to perform one or more of the non-ALD and non-CVD steps described herein, such as exposing the substrate to plasma to deliberately damage the top surface of the dielectric material as described in relation to FIG. 2, and/or exposing the substrate to reducing gas or plasma to reduce the top surface of the metal oxide barrier layer to an in-situ metal liner as described in relation to FIGS. 6 and 7, and/or exposing the substrate to an anneal or plasma to convert a metal nitride seed layer precursor to a metal seed layer as described in relation to FIG. 8, and/or electroplating conductive metal onto the seed layer. Where one or more of the modules 1107A/1107B are configured to perform electroplating, the module 1107A/1107B may be as described in relation to FIG. 12, for example. In a particular embodiment, the system 1100 includes a sufficient number of modules (e.g., similar to modules 1107A and 1107B) to accomplish each of the steps described herein. In some cases, the module 1107A and/or 1107B may be used for various other purposes, for example to perform etching or polishing.

The system 1100 also includes one or more wafer source modules 1101, where wafers are stored before and after processing. An atmospheric robot (not shown) in the atmospheric transfer chamber 1119 may first remove wafers from the source modules 1101 to loadlocks 1121. A wafer transfer device (generally a robot arm unit) in the transfer module 1103 moves the wafers from loadlocks 1121 to and among the modules mounted on the transfer module 1103.

In various embodiments, a system controller 1129 is employed to control process conditions during deposition. The controller 1129 will typically include one or more memory devices and one or more processors. A processor may include a CPU or computer, analog and/or digital input/output connections, stepper motor controller boards, etc.

The controller 1129 may control all of the activities of the deposition apparatus. The system controller 1129 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 1129 may be employed in some embodiments.

Typically there will be a user interface associated with the controller 1129. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the reactant flows and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 1129. The signals for controlling the process are output on the analog and digital output connections of the deposition apparatus 1100.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

Figure 12:
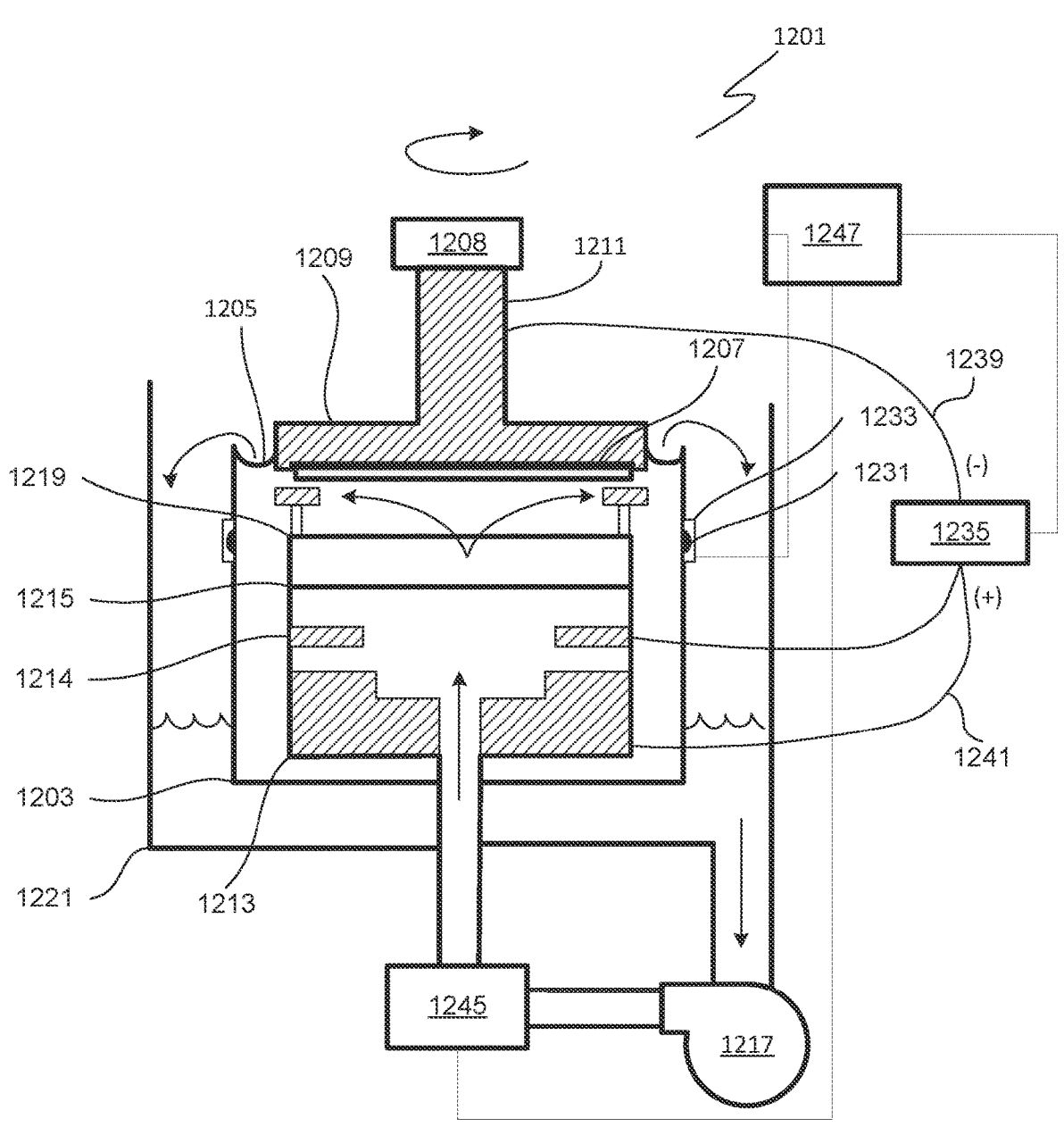
FIG. 12 illustrates a processing vessel configured to perform electrodeposition.

FIG. 12 presents an example of an electroplating cell in which electroplating may occur. For example, with reference to FIG. 1, the conductive metal 109 may be deposited in the electroplating cell of FIG. 12. Often, an electroplating apparatus includes one or more electroplating cells in which the substrates (e.g., wafers) are processed. Only one electroplating cell is shown in FIG. 12 to preserve clarity. To optimize bottom-up electroplating, additives (e.g., accelerators, suppressors, and levelers) are added to the electrolyte; however, an electrolyte with additives may react with the anode in undesirable ways. Therefore anodic and cathodic regions of the plating cell are sometimes separated by a membrane so that plating solutions of different composition may be used in each region. Plating solution in the cathodic region is called catholyte; and in the anodic region, anolyte. A number of engineering designs can be used in order to introduce anolyte and catholyte into the plating apparatus.

Referring to FIG. 12, a diagrammatical cross-sectional view of an electroplating apparatus 1201 in accordance with one embodiment is shown. The plating bath 1203 contains the plating solution (having a composition as provided herein), which is shown at a level 1205. The catholyte portion of this vessel is adapted for receiving substrates in a catholyte. A wafer 1207 is immersed into the plating solution and is held by, e.g., a "clamshell" substrate holder 1209, mounted on a rotatable spindle 1211, which allows rotation of clamshell substrate holder 1209 together with the wafer 1207.

An anode 1213 is disposed below the wafer within the plating bath 1203 and is separated from the wafer region by a membrane 1215, preferably an ion selective membrane. For example, Nafion™ cationic exchange membrane (CEM) may be used. The region below the anodic membrane is often referred to as an "anode chamber." The ion-selective anode membrane 1215 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Ion exchange membranes, such as cationic exchange membranes, are especially suitable for these applications. These membranes are typically made of ionomeric materials, such as perfluorinated co-polymers containing sulfonic groups (e.g. Nafion™), sulfonated polyimides, and other materials known to those of skill in the art to be suitable for cation exchange. Selected examples of suitable Nafion™ membranes include N324 and N424 membranes available from Dupont de Nemours Co.

During plating the ions from the plating solution are deposited on the substrate. The metal ions must diffuse through the diffusion boundary layer and into the interconnect hole or other feature. A typical way to assist the diffusion is through convection flow of the electroplating solution provided by the pump 1217. Additionally, a vibration agitation or sonic agitation member may be used as well as wafer rotation. For example, a vibration transducer 1208 may be attached to the clamshell substrate holder 1209.

The plating solution is continuously provided to plating bath 1203 by the pump 1217. Generally, the plating solution flows upwards through an anode membrane 1215 and a diffuser plate 1219 to the center of wafer 1207 and then radially outward and across wafer 1207. The plating solution also may be provided into the anodic region of the bath from the side of the plating bath 1203. The plating solution then overflows plating bath 1203 to an overflow reservoir 1221. The plating solution is then filtered (not shown) and returned to pump 1217 completing the recirculation of the plating solution. In certain configurations of the plating cell, a distinct electrolyte is circulated through the portion of the plating cell in which the anode is contained while mixing with the main plating solution is prevented using sparingly permeable membranes or ion selective membranes.

A reference electrode 1231 is located on the outside of the plating bath 1203 in a separate chamber 1233, which chamber is replenished by overflow from the main plating bath 1203. Alternatively, in some embodiments the reference electrode is positioned as close to the substrate surface as possible, and the reference electrode chamber is connected via a capillary tube or by another method, to the side of the wafer substrate or directly under the wafer substrate. In some of the preferred embodiments, the apparatus further includes contact sense leads that connect to the wafer periphery and which are configured to sense the potential of the metal seed layer at the periphery of the wafer but do not carry any current to the wafer.

A reference electrode 1231 is typically employed when electroplating at a controlled potential is desired. The reference electrode 1231 may be one of a variety of commonly used types such as mercury/mercury sulfate, silver chloride, saturated calomel, or copper metal. A contact sense lead in direct contact with the wafer 1207 may be used in some embodiments, in addition to the reference electrode, for more accurate potential measurement (not shown).

A DC power supply 1235 can be used to control current flow to the wafer 1207. The power supply 1235 has a negative output lead 1239 electrically connected to wafer 1207 through one or more slip rings, brushes and contacts (not shown). The positive output lead 1241 of power supply 1235 is electrically connected to an anode 1213 located in plating bath 1203. The power supply 1235, a reference electrode 1231, and a contact sense lead (not shown) can be connected to a system controller 1247, which allows, among other functions, modulation of current and potential provided to the elements of electroplating cell. For example, the controller may allow electroplating in potential-controlled and current-controlled regimes. The controller may include program instructions specifying current and voltage levels that need to be applied to various elements of the plating cell, as well as times at which these levels need to be changed. When forward current is applied, the power supply 1235 biases the wafer 1207 to have a negative potential relative to anode 1213. This causes an electrical current to flow from anode 1213 to the wafer 1207, and an electrochemical reduction (e.g. $Cu^{2+}+2\ e^-=Cu^0$) occurs on the wafer surface (the cathode), which results in the deposition of the electrically conductive layer (e.g. copper) on the surfaces of the wafer. An inert anode 1214 may be installed below the wafer 1207 within the plating bath 1203 and separated from the wafer region by the membrane 1215.

The apparatus may also include a heater 1245 for maintaining the temperature of the plating solution at a specific level. The plating solution may be used to transfer the heat to the other elements of the plating bath. For example, when a wafer 1207 is loaded into the plating bath the heater 1245 and the pump 1217 may be turned on to circulate the plating solution through the electroplating apparatus 1201, until the temperature throughout the apparatus becomes substantially uniform. In one embodiment the heater is connected to the system controller 1247. The system controller 1247 may be connected to a thermocouple to receive feedback of the plating solution temperature within the electroplating apparatus and determine the need for additional heating.

The controller will typically include one or more memory devices and one or more processors. The processor may include a CPU or computer, analog and/or digital input/output connections, stepper motor controller boards, etc. In certain embodiments, the controller controls all of the activities of the electroplating apparatus. Non-transitory machine-readable media containing instructions for controlling process operations in accordance with the present embodiments may be coupled to the system controller.

Typically there will be a user interface associated with controller 1247. The user interface may include a display screen, graphical software displays of the apparatus and/or process conditions, and user input devices such as pointing devices, keyboards, touch screens, microphones, etc. The computer program code for controlling electroplating processes can be written in any conventional computer readable programming language: for example, assembly language, C, C++, Pascal, Fortran or others. Compiled object code or script is executed by the processor to perform the tasks identified in the program. One example of a plating apparatus that may be used according to the embodiments herein is the Lam Research Sabre tool. Electrodeposition can be performed in components that form a larger electrodeposition apparatus.

Figure 13:
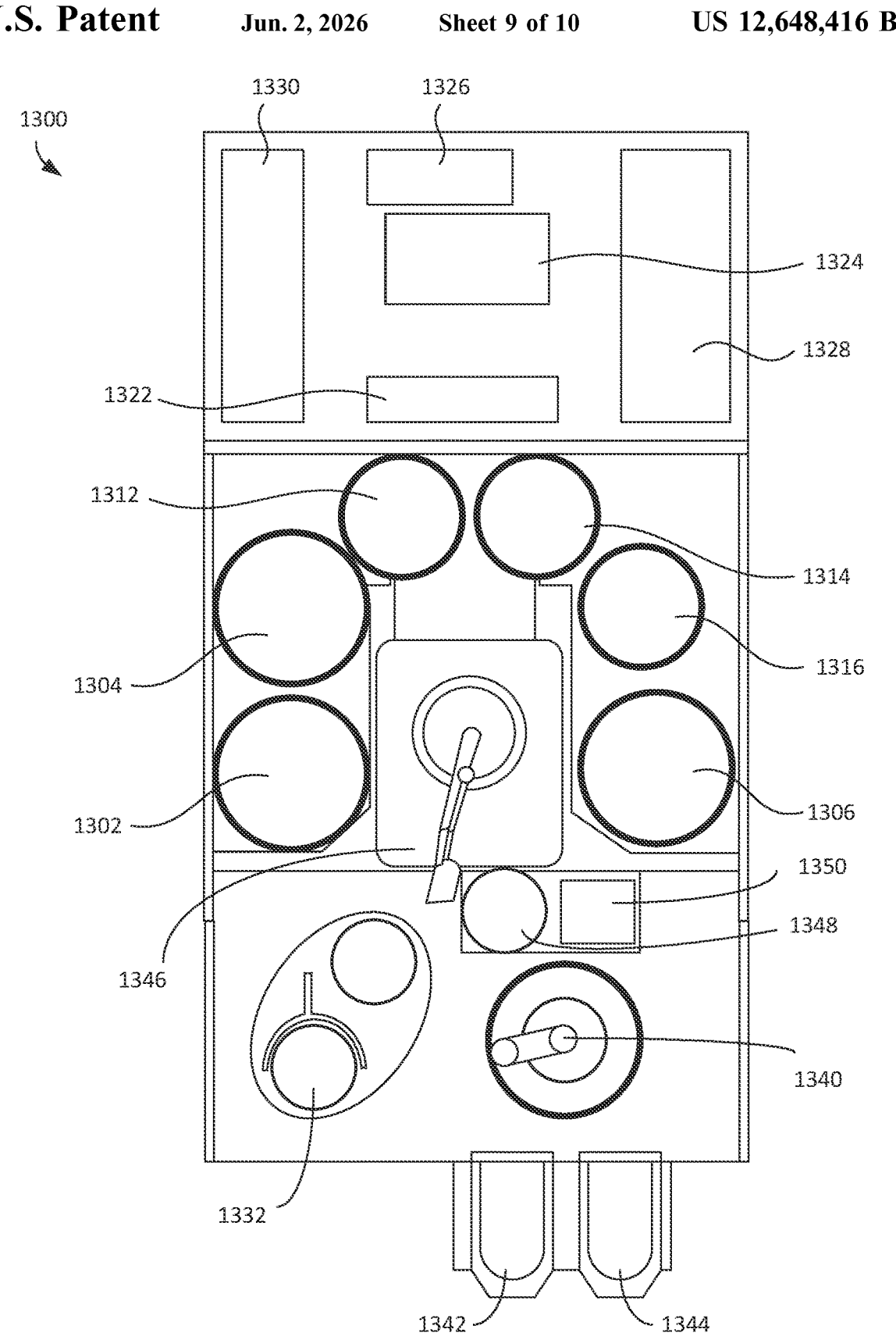
FIG. 13 depicts an electrodeposition apparatus that may be configured to perform electroplating and various other processing operations described herein.

FIG. 13 shows a schematic of a top view of an example electrodeposition apparatus. The electrodeposition apparatus 1300 can include three separate electroplating modules 1302, 1304, and 1306. The electrodeposition apparatus 1300 can also include three separate modules 1312, 1314, and 1316 configured for various process operations, including the operations described herein. For example, in some embodiments, one or more of modules 1312, 1314, and 1316 may be a spin rinse drying (SRD) module. In these or other embodiments, one or more of the modules 1312, 1314, and 1316 may be post-electrofill modules (PEMs), each configured to perform a function, such as edge bevel removal, backside etching, and acid cleaning of substrates after they have been processed by one of the electroplating modules 1302, 1304, and 1306. In these or other embodiments, each of modules 1312, 1314, and 1316 may be independently configured to perform one or more steps described herein such as exposing the substrate to plasma to deliberately damage the top surface of the dielectric material as described in relation to FIG. 2, and/or depositing a metal oxide barrier layer through CVD and/or ALD as described in relation to FIGS. 3 and 4, respectively, and/or exposing the substrate to reducing gas or plasma to reduce the top surface of the metal oxide barrier layer to an in-situ metal liner as described in relation to FIGS. 6 and 7, and/or depositing a metal seed layer or a metal nitride seed layer precursor as described in relation to FIGS. 7 and 8, and/or exposing the substrate to an anneal or plasma to convert a metal nitride seed layer precursor to a metal seed layer as described in relation to FIG. 8. While only three modules 1312, 1314, and 1316 are shown for performing operations other than electroplating, it is understood that any number of modules may be provided as appropriate for a particular application.

The electrodeposition apparatus 1300 includes a central electrodeposition chamber 1324. The central electrodeposition chamber 1324 is a chamber that holds the chemical solution used as the electroplating solution in the electroplating modules 1302, 1304, and 1306. The electrodeposition apparatus 1300 also includes a dosing system 1326 that may store and deliver additives for the electroplating solution. A chemical dilution module 1322 may store and mix chemicals to be used as an etchant. A filtration and pumping unit 1328 may filter the electroplating solution for the central electrodeposition chamber 1324 and pump it to the electroplating modules.

A system controller 1330 provides electronic and interface controls required to operate the electrodeposition apparatus 1300. The system controller 1330 (which may include one or more physical or logical controllers) controls some or all of the properties of the electroplating apparatus 1300.

Signals for monitoring the process may be provided by analog and/or digital input connections of the system controller 1330 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

A hand-off tool 1340 may select a substrate from a substrate cassette such as the cassette 1342 or the cassette 1344. The cassettes 1342 or 1344 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 1340 may hold the substrate using a vacuum attachment or some other attaching mechanism.

The hand-off tool 1340 may interface with a wafer handling station 1332, the cassettes 1342 or 1344, a transfer station 1350, or an aligner 1348. From the transfer station 1350, a hand-off tool 1346 may gain access to the substrate. The transfer station 1350 may be a slot or a position from and to which hand-off tools 1340 and 1346 may pass substrates without going through the aligner 1348. In some embodiments, however, to ensure that a substrate is properly aligned on the hand-off tool 1346 for precision delivery to an electroplating module, the hand-off tool 1346 may align the substrate with an aligner 1348. The hand-off tool 1346 may also deliver a substrate to one of the electroplating modules 1302, 1304, or 1306 or to one of the three separate modules 1312, 1314, and 1316 configured for various process operations.

An example of a process operation according to the methods described above may proceed as follows: (1) electrodeposit copper or another material onto a substrate in the electroplating module 1304; (2) rinse and dry the substrate in SRD in module 1312; and, (3) perform edge bevel removal in module 1314.

An apparatus configured to allow efficient cycling of substrates through sequential plating, rinsing, drying, and PEM process operations may be useful for implementations for use in a manufacturing environment. To accomplish this, the module 1312 can be configured as a spin rinse dryer and an edge bevel removal chamber. With such a module 1312, the substrate would only need to be transported between the electroplating module 1304 and the module 1312 for the copper plating and EBR operations. In some embodiments the methods described herein will be implemented in a system which comprises an electroplating apparatus and a stepper.

Figure 14:
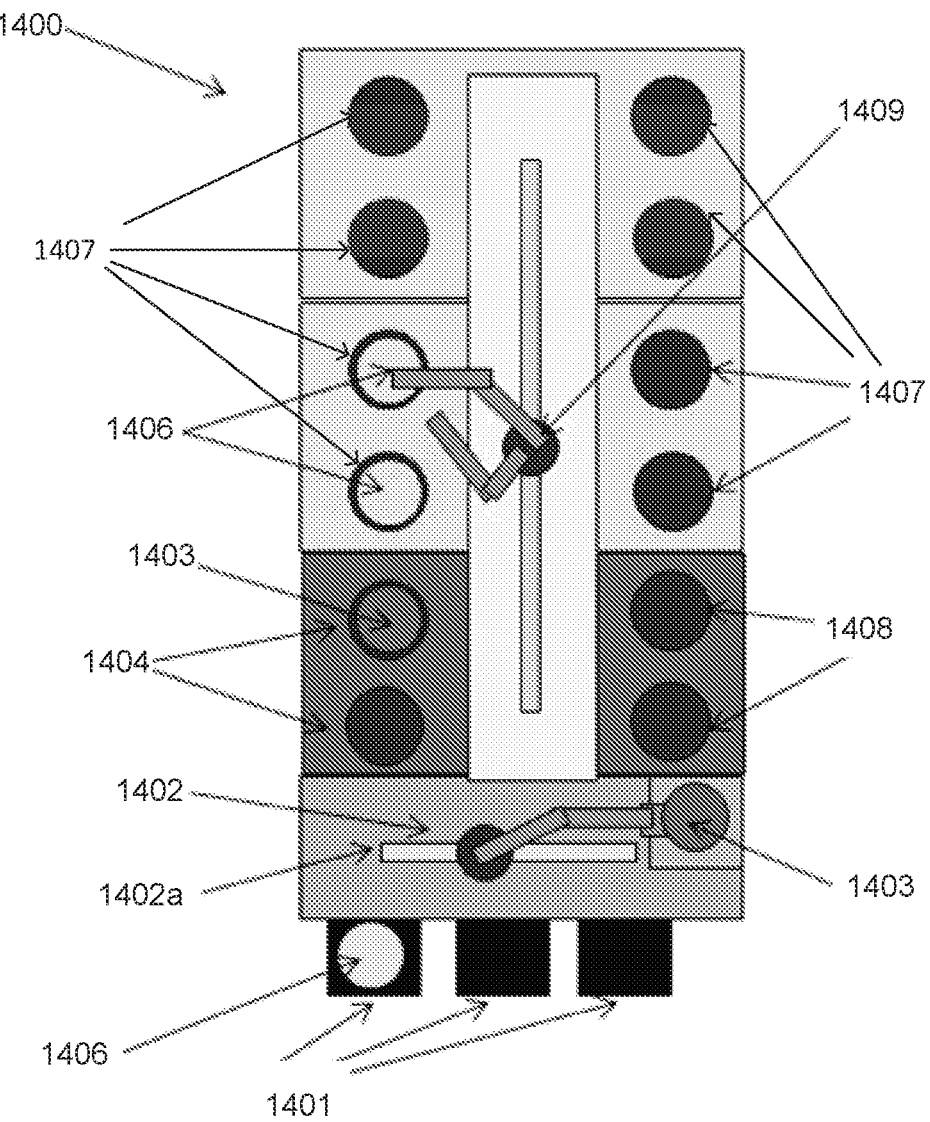
FIG. 14 depicts another electrodeposition apparatus that may be configured to perform electroplating and various other processing operations described herein.

An alternative embodiment of an electrodeposition apparatus 1400 is schematically illustrated in FIG. 14. In this embodiment, the electrodeposition apparatus 1400 has a set of electroplating cells 1407, each containing an electroplating bath, in a paired or multiple "duet" configuration. In addition to electroplating per se, the electrodeposition apparatus 1400 may perform a variety of other electroplating and non-electroplating related processes and sub-steps, such as spin-rinsing, spin-drying, metal and silicon wet etching, electroless deposition, pre-wetting and pre-chemical treating, reducing, annealing, plasma treating, atomic layer deposition, chemical vapor deposition, electro-etching and/or electropolishing, photoresist stripping, and surface pre-activation, for example. Any of the steps that may be performed in the various modules of FIG. 13 may be performed in electrodeposition apparatus 1400. The electrodeposition apparatus 1400 is shown schematically looking top down in FIG. 14, and only a single level or "floor" is revealed in the figure, but it is to be readily understood by one having ordinary skill in the art that such an apparatus, e.g., the Lam Sabre™ 3D tool, can have two or more levels "stacked" on top of each other, each potentially having identical or different types of processing stations.

Referring once again to FIG. 14, the substrates 1406 that are to be electroplated are generally fed to the electrodeposition apparatus 1400 through a front end loading FOUP 1401 and, in this example, are brought from the FOUP to the main substrate processing area of the electrodeposition apparatus 1400 via a front-end robot 1402 that can retract and move a substrate 1406 driven by a spindle 1403 in multiple dimensions from one station to another of the accessible stations-two front-end accessible stations 1404 and also two front-end accessible stations 1408 are shown in this example. The front-end accessible stations 1404 and 1408 may include, for example, pre-treatment stations, and spin rinse drying (SRD) stations. Lateral movement from side-to-side of the front-end robot 1402 is accomplished utilizing robot track 1402*a*. Each of the substrates 1406 may be held by a cup/cone assembly (not shown) driven by a spindle 1403 connected to a motor (not shown), and the motor may be attached to a mounting bracket 1409. Also shown in this example are the four "duets" of electroplating cells 1407, for a total of eight electroplating cells 1407. A system controller (not shown) may be coupled to the electrodeposition apparatus 1400 to control some or all of the properties of the electrodeposition apparatus 1400. The system controller may be programmed or otherwise configured to execute instructions according to processes described earlier herein.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of forming an interconnect structure, or a portion thereof, on a substrate, the method comprising:

(a) receiving the substrate in a processing chamber, wherein the substrate comprises a dielectric material with recessed features formed in the dielectric material, wherein the interconnect structure is to be formed in the recessed features, and wherein the dielectric material is exposed within the recessed features;

(b) exposing the substrate to a plasma to thereby modify a top surface of the dielectric material;

(c) after (b), forming a metal oxide barrier layer on the modified top surface of the dielectric material, wherein the metal oxide barrier layer is formed, at least in part, through atomic layer deposition (ALD) and/or chemical vapor deposition (CVD); and (d) after (c), exposing the substrate to a reducing gas or a reducing plasma generated from the reducing gas, thereby reducing a top surface of the metal oxide barrier layer and forming an in-situ metal liner on the metal oxide barrier layer.

2. The method of claim 1, wherein exposing the substrate to the plasma in (b) roughens the top surface of the dielectric material.

3. The method of claim 1, wherein exposing the substrate to the plasma in (b) promotes nucleation of the metal oxide barrier layer in (c) and improves adhesion between the dielectric material and the metal oxide barrier layer.

4. The method of claim 1, wherein exposing the substrate to the plasma in (b) comprises exposing the substrate to the plasma generated from a process gas selected from the group consisting of: $H_2$, $O_2$, $NH_3$, $CO_2$, $N_2O$, $N_2$, and combinations thereof.

5. The method of claim 1, wherein forming the metal oxide barrier layer comprises (i) forming a first portion of the metal oxide barrier layer through thermal ALD or thermal CVD, and (ii) forming a second portion of the metal oxide barrier layer through plasma enhanced ALD (PEALD) or plasma enhanced CVD (PECVD), wherein the first portion of the metal oxide barrier layer is formed before the second portion of the metal oxide barrier layer.

6. The method of claim 1, wherein the metal oxide barrier layer is formed using a metal-containing reactant selected from the group consisting of: a magnesium-containing reactant, a titanium-containing reactant, a molybdenum-containing reactant, a tungsten-containing reactant, a ruthenium-containing reactant, a cobalt-containing reactant, a copper-containing reactant, a zinc-containing reactant, an aluminum-containing reactant, an indium-containing reactant, a tin-containing reactant, a manganese-containing reactant, and combinations thereof.

7. The method of claim 6, wherein the metal-containing reactant is selected from the group consisting of: bis(1,4-di-tert-butyl-diazadiene)magnesium, bis(ethylcyclopentadienyl)magnesium, tetrakis(dimethylamido)titanium, hexafluoromolybdenum, pentachloromolybdenum, molybdenum dichloride dioxide, molybdenum tetrachloride oxide, molybdenum hexacarbonyl, hexachlorotungsten, dodecacarbonyltriruthenium, octacarbonyldicobalt, bis(dimethylamino-2-propoxy)copper, bis(dimethylaminoethoxy)copper, bis(diethylamino-2-propoxy)copper, bis(ethylmethylamino-2-propoxy)copper, bis(dimethylamino-2-methyl-2-butoxy) copper, bis(N,N'-di-sec-butylacetamidinate)dicopper, dimethylzinc, diethylzinc, diallylzinc, bis(2-methylallyl)zinc, trimethylaluminum, trimethylindium, tetrakis(dimethylamido)tin, tin(IV) chloride, tin(IV) chloride, tin(IV) bromide, stannane, trimethyltin chloride, dimethyltin dichloride, methyltin trichloride, tetraethyltin, tetramethyltin, dibutyltin diacetate, (dimethylamino)trimethyltin(IV), bis[bis(trimethylsilyl)amino]tin(II), dibutyldiphenyltin, hexaphenylditin (IV), tetraallyltin, tetrakis(diethylamino)tin(IV), tetravinyltin, tin(II)acetylacetonate, tricyclohexyltin hydride, trimethyl(phenylethynyl)tin, trimethyl(phenyl)tin, tetrakis(ethylmethylamino)tin, tin(II)(1,3-bis(1,1-dimethylethyl)-4, 5-dimethyl-(4R,5R)-1,3,2-diazastannolidin-2-ylidene, $N^2,N^3$-di-tert-butyl-butane-2,4-diamino-tin(II), bis(cyclopentadienyl)manganese, bis(ethylcyclopentadienyl)manganese, bis(tetramethylcyclopentadienyl)manganese, bis(pentamethylcyclopentadienylmanganese, bis(1,4-di-tert-butyl-diazadiene)manganese, bis(bis(trimethylsilylamido)) manganese, bis(bis(ethyldimethylsilylamido))manganese, bis(N,N'-diisopropylpentylamidinato)manganese, and combinations thereof.

8. The method of claim 1, wherein (d) comprises exposing the substrate to the reducing gas, and wherein exposing the substrate to the reducing gas improves an adhesion of a subsequently deposited layer.

9. The method of claim 8, wherein the subsequently deposited layer is a metal seed layer or a metal nitride seed layer precursor.

10. The method of claim 1, wherein (d) comprises exposing the substrate to the reducing gas, and wherein the reducing gas comprises $H_2$ and/or a molecule that includes both nitrogen and hydrogen.

11. The method of claim 1, further comprising:

after (c), forming a metal seed layer or a metal nitride seed layer precursor on the substrate through the ALD or the CVD.

12. The method of claim 11, wherein the metal seed layer or metal nitride seed layer precursor comprise a metal selected from the group consisting of: copper, cobalt, iridium, molybdenum, palladium, ruthenium, tungsten, and combinations thereof.

13. The method of claim 11, wherein the metal seed layer or metal nitride seed layer precursor are deposited using a metal-containing reactant selected from the group consisting of: a molybdenum-containing reactant, a tungsten-containing reactant, a ruthenium-containing reactant, a cobalt-containing reactant, an iridium-containing reactant, a copper-containing reactant, a palladium-containing reactant, and combinations thereof.

14. The method of claim 13, wherein the metal-containing reactant is selected from the group consisting of: hexafluoromolybdenum, pentachloromolybdenum, molybdenum dichloride dioxide, molybdenum tetrachloride oxide, molybdenum hexacarbonyl, hexafluorotungsten, hexachlorotungsten, pentachlorotungsten, bis(tert-butylimido)bis(dimethylamido)tungsten, dodecacarbonyltriruthenium, (2,4-dimethylpentadienyl)ethylcyclopentadienylruthenium, (1-ethyl-1,4-cyclohexadienyl)ethylbenzeneruthenium, bis (ethylcyclopentadienyl)ruthenium, tetraoxoruthenium, octacarbonyldicobalt, (2-tert-butylallyl)tricabonylcobalt, (3,3-dimethyl-1-butyne)hexacarbonyldicobalt, cyclopentadienyldicarbonylcobalt, bis(1,4-diisopropyl-diazadiene)cobalt, bis(1,4-di-tert-butyl-diazadiene)cobalt, bis (N,N'-diisopropylacetamidinato)cobalt, bis(N-tert-butyl-N'-ethylpropanimidamidinato)cobalt, tris(acetylacetonate) iridium, bis(dimethylamino-2-propoxy)copper, bis (dimethylaminoethoxy)copper, bis(diethylamino-2-propoxy)copper, bis(ethylmethylamino-2-propoxy)copper, bis(dimethylamino-2-methyl-2-butoxy)copper bis(N,N'-di-sec-butylacetamidinate)dicopper, 1-methylallyl(hexafluoroacetylacetonato)-palladium(II), bis(hexafluoroacetylacetonato)palladium, and combinations thereof.

15. The method of claim 11, further comprising forming a liner on the metal oxide barrier layer through the ALD and/or the CVD, wherein the liner is formed prior to formation of the metal seed layer or the metal nitride seed layer precursor.

16. The method of claim 11, further comprising exposing the substrate to an anneal process or a plasma treatment process to thereby convert the metal nitride seed layer precursor to the metal seed layer.

17. The method of claim 16, wherein the anneal process or the plasma treatment process converts a copper nitride seed layer precursor to a copper seed layer.

18. The method of claim 1, wherein forming the metal oxide barrier layer in (c) comprises (i) forming a barrier layer precursor comprising at least one material selected from the group consisting of an elemental metal, a metal carbide, and a metal nitride, wherein the barrier layer precursor is formed through the ALD and/or the CVD, and (ii) exposing the barrier layer precursor to an oxygen-containing atmosphere to thereby convert the barrier layer precursor to the metal oxide barrier layer.

19. A system for forming an interconnect structure, or a portion thereof, on a substrate, the system comprising:

a. a first processing chamber; and b. a controller having at least one processor and a memory, wherein the at least one processor and the memory are communicatively connected with one another, and the memory stores computer-executable instructions for controlling the at least one processor to cause:

(i) receiving the substrate in the first processing chamber, wherein the substrate comprises a dielectric material with recessed features formed in the dielectric material, wherein the interconnect structure is to be formed in the recessed features, and wherein the dielectric material is exposed within the recessed features;

(ii) exposing the substrate to a plasma in the first processing chamber to thereby modify a top surface of the dielectric material;

(iii) after (ii), forming a metal oxide barrier layer on the modified top surface of the dielectric material, wherein the metal oxide barrier layer is formed, at least in part, through atomic layer deposition (ALD) and/or chemical vapor deposition (CVD); and (iv) after (iii), exposing the substrate to a reducing gas or a reducing plasma generated from the reducing gas, thereby reducing a top surface of the metal oxide barrier layer and forming an in-situ metal liner on the metal oxide barrier layer.

20. The system of claim 19, further comprising a second processing chamber, wherein the memory stores computer-executable instructions for controlling the at least one processor to cause:

transferring the substrate from the first processing chamber to the second processing chamber, and forming a metal seed layer or a metal nitride seed layer precursor on the metal oxide barrier layer through the ALD and/or the CVD while the substrate is positioned in the second processing chamber.

21. The system of claim 20, wherein the memory stores computer-executable instructions for controlling the at least one processor to cause:

prior to forming the metal seed layer or the metal nitride seed layer precursor, exposing the substrate to a reducing gas or a reducing plasma in the second processing chamber, thereby reducing an upper surface of the metal oxide barrier layer and forming an in-situ metal liner, wherein the metal seed layer or metal nitride seed layer precursor forms on the in-situ metal liner.

22. The system of claim 21, wherein the substrate is not exposed to atmosphere between exposing the substrate to the reducing gas or the reducing plasma and forming the metal seed layer or the metal nitride seed layer precursor.

23. The system of claim 20, wherein the memory stores computer-executable instructions for controlling the at least one processor to cause:

exposing the substrate to an anneal process or a plasma treatment process to thereby convert the metal nitride seed layer precursor to the metal seed layer.

24. The system of claim 20, wherein at least one of the first and second processing chambers is configured to deposit a liner on the metal oxide barrier layer, and wherein the liner is deposited through the ALD and/or the CVD.

25. The system of claim 20, wherein the first processing chamber is positioned on a first apparatus and the second processing chamber is positioned on a second apparatus.

26. The system of claim 25, further comprising a third processing chamber, wherein the memory stores computer-executable instructions for controlling the at least one processor to cause:

transferring the substrate from the second processing chamber to the third processing chamber and electroplating metal onto the metal seed layer while the substrate is in the third processing chamber.

27. The system of claim 26, wherein the second processing chamber and the third processing chamber are each part of the second apparatus.

28. The system of claim 26, wherein the memory stores computer-executable instructions for controlling the at least one processor to cause:

transferring the substrate from the second processing chamber to the third processing chamber without exposing the substrate to atmosphere.

29. The system of claim 24, wherein the memory stores computer-executable instructions for controlling the at least one processor to cause:

exposing the substrate to atmosphere while transferring the substrate from the first processing chamber to the second processing chamber.

30. The system of claim 19, wherein the memory stores computer-executable instructions for controlling the at least one processor to cause:

forming the metal oxide barrier layer by (i) forming a barrier layer precursor comprising at least one material selected from the group consisting of an elemental metal, a metal carbide, and a metal nitride, wherein the barrier layer precursor is formed through the ALD and/or the CVD, and (ii) exposing the barrier layer precursor to an oxygen-containing atmosphere to thereby convert the barrier layer precursor to the metal oxide barrier layer.

* * * * *